US012782470B2

(12) United States Patent
Kikuchi et al.

(10) Patent No.: US 12,782,470 B2
(45) Date of Patent: Nov. 3, 2026

(54) MAGNETIC SENSOR

(71) Applicant: Alps Alpine Co., Ltd., Tokyo (JP)

(72) Inventors: Kanta Kikuchi, Niigata-ken (JP); Eiji Umetsu, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 294 days.

(21) Appl. No.: 18/799,230

(22) Filed: Aug. 9, 2024

(65) Prior Publication Data

US 2024/0402267 A1 Dec. 5, 2024

Related U.S. Application Data

(63) Continuation of application No. PCT/JP2023/004035, filed on Feb. 7, 2023.

(30) Foreign Application Priority Data

Mar. 9, 2022 (JP) ................................ 2022-036551

(51) Int. Cl.
*G01R 33/09* (2006.01)
*G01R 15/20* (2006.01)

(52) U.S. Cl.
CPC ........... *G01R 33/09* (2013.01); *G01R 15/207* (2013.01)

(58) Field of Classification Search
None
See application file for complete search history.

(56) References Cited

U.S. PATENT DOCUMENTS 8,027,110 B1 * 9/2011 Yamanaka ............. G11B 5/314 360/31
9,702,748 B2 * 7/2017 Engel ................... G01R 33/072
2003/0094944 A1 5/2003 Suzuki et al.
(Continued)

FOREIGN PATENT DOCUMENTS

JP 2001-036017 2/2001
JP 2001-194181 7/2001
(Continued)

OTHER PUBLICATIONS

Japanese Notice of Reasons for Refusal with English translation dated Sep. 4, 2024 from Japanese Application No. 2024-505957.
(Continued)

*Primary Examiner* — Jermele M Hollington
(74) *Attorney, Agent, or Firm* — Beyer Law Group LLP

(57) ABSTRACT

The magnetic sensor of the present invention includes a substrate, a magnetic detection element having an output signal characteristic of an even function for a magnetic field formed through an insulating layer on the substrate and having a detection axis in an X-axis direction in an in-plane direction of the substrate, an AC electric wiring capable of applying an AC magnetic field to the magnetic detection element, and a DC electric wiring capable of applying a DC magnetic field to the magnetic detection element. Since the magnetic detection element, the AC electric wiring and the DC electric wiring are isolated from one another and at least a portion of the AC electric wiring is buried in the substrate, an increase in power consumption caused by an increase in resistance of the AC electric wiring is suppressed when an alternate current is supplied, and high magnetic resolution is attained.

10 Claims, 14 Drawing Sheets

(56) References Cited

U.S. PATENT DOCUMENTS

| | | | | |
|---|---|---|---|---|
| 2006/0164757 | A1 | 7/2006 | Na | |
| 2008/0074109 | A1 | 3/2008 | Tsukada et al. | |
| 2014/0191751 | A1 * | 7/2014 | Suzuma | G01N 27/82<br>324/232 |
| 2018/0271395 | A1 | 9/2018 | Iwasaki et al. | |
| 2019/0369172 | A1 | 12/2019 | Kikitsu et al. | |
| 2020/0200838 | A1 * | 6/2020 | Kiyono | G01R 33/0094 |
| 2020/0319269 | A1 * | 10/2020 | Shirotori | G01R 33/0011 |

FOREIGN PATENT DOCUMENTS

| | | |
|---|---|---|
| JP | 2006-30004 | 2/2006 |
| JP | 2006-267120 | 10/2006 |
| JP | 2017-3336 | 1/2017 |
| JP | 2018-155719 | 10/2018 |
| JP | 2019-207167 | 12/2019 |
| JP | 2021-018057 | 2/2021 |

OTHER PUBLICATIONS

Japanese Final Notice of Reasons for Refusal with English translation dated Mar. 11, 2025from Japanese Application No. 2024-505957.

International Search Report from International Application No. PCT/JP2023/004035 dated Apr. 11, 2023 with machine translation.

* cited by examiner

MAGNETIC SENSOR

CLAIM OF PRIORITY

This application is a Continuation of International Application No. PCT/JP2023/004035 filed on Feb. 7, 2023, which claims benefit of Japanese Patent Application No. 2022-036551 filed on Mar. 9, 2022. The entire contents of each application noted above are hereby incorporated by reference.

BACKGROUND OF THE INVENTION

1. Field of the Invention

The present invention relates to a highly efficient magnetic sensor with reduced power consumption provided with AC electric wiring capable of applying an AC magnetic field to a magnetic detection element and DC electric wiring.

2. Description of the Related Art

In order to enable highly sensitive magnetic field detection, a magnetic sensor including a magnetic detection element and an AC electric wiring that applies an AC magnetic field to the magnetic detection element has been proposed.

Japanese Unexamined Patent Application Publication No. 2017-3336 describes a magnetic measuring device including a magnetic sensor in which an output characteristic of an output voltage for a magnetic field is an even function and a modulating coil in which a modulated AC magnetic field is applied to the magnetic sensor, and discloses that an alternate current and a direct current are applied to a wiring near a GMR element to generate an AC magnetic field and a DC magnetic field.

In Japanese Unexamined Patent Application Publication No. 2018-155719, it is described that an alternate current is supplied to a first wiring in a magnetic sensor in which a first electric resistance of a first sensor element changes in accordance with a first magnetic layer, a current flowing through the first wiring, and a magnetic field to be detected which is applied to the first sensor element. In Japanese Unexamined Patent Application Publication No. 2019-207167, a magnetic sensor including wiring for supplying an alternate current to a magnetic detection element is described. According to the magnetic sensors described in these documents, an external magnetic field may be detected with high accuracy by modulation using an AC magnetic field.

In a magnetic sensor including a magnetic detection element and AC electric wiring that generates an AC magnetic field, there is a problem that Joule heat is generated in the AC electric wiring due to supply of an alternate current which applies an AC magnetic field to the magnetic detection element, and therefore, resistance rises and power consumption of the AC electric wiring increases. Another problem is that sensitivity of the magnetic detection element decreases due to influence of the heat generation in the AC electric wiring, and detection performance of the magnetic sensor is deteriorated.

SUMMARY OF THE INVENTION

The present invention provides a magnetic sensor with high magnetic resolution in which an increase in power consumption due to an increase in resistance of an AC electric wiring is suppressed when an alternate current is supplied.

The present invention provides the following configuration as means for solving the above-mentioned problems: A magnetic sensor includes a substrate, a magnetic detection element formed through an insulating layer on the substrate and having an output signal characteristic of an even function for a magnetic field having a detection axis in an in-plane direction of the substrate, an alternate current (AC) electric wiring capable of applying an AC magnetic field to the magnetic detection element, a direct current (DC) electric wiring capable of applying a DC magnetic field to the magnetic detection element. The magnetic detection element, the AC electric wiring, and the DC electric wiring are isolated from one another. At least a portion of the AC electric wiring is formed by being buried in the substrate.

Since the AC electric wiring is buried in the substrate, Joule heat generated in the AC electric wiring may be efficiently dissipated to the substrate, and therefore, resistance rise is unlikely to occur in the AC electric wiring. Since the AC electric wiring having a larger cross-sectional area may be formed when compared with a case where the AC electric wiring is formed in the insulating film, resistivity of the AC electric wiring may be reduced. Furthermore, since the AC electric wiring is buried in the substrate, a distance between the magnetic detection element and the AC electric wiring may be reduced. Accordingly, a magnetic field to be applied to the magnetic detection element may be increased without increasing an amount of current flowing through the AC electric wiring.

In the magnetic sensor, at least a portion of the DC electric wiring may be buried in the substrate. With this configuration, effects of efficient heat dissipation, resistivity reduction and distance reduction may be achieved for the DC electric wiring as well as for the AC electric wiring, and power consumption of both the AC and DC electric wirings may be reduced.

The AC electric wiring may be arranged between the magnetic detection element and the DC electric wiring when viewed from a normal direction of the substrate and a direction orthogonal to a direction of a detection axis of the magnetic detection element. Since the AC electric wiring is arranged close to the magnetic detection element, current flowing to the AC electric wiring to which the current is continuously applied may be reduced, and therefore, power consumption of the entire magnetic sensor may be reduced.

The DC electric wiring may be formed in parallel with the AC electric wiring when viewed from the normal direction of the substrate and the direction orthogonal to the direction of the detection axis of the magnetic detection element. Since the DC electric wiring and the AC electric wiring are arranged in parallel, at least a portion of the two types of electric wiring may be manufactured in the same wiring formation process.

When the AC electric wiring and the magnetic detection element are formed in parallel, the AC electric wiring may be arranged to have a portion overlapped with the magnetic detection element when viewed from the normal direction of the substrate. Since the AC electric wiring is disposed closer to the magnetic detection element than the DC electric wiring in parallel arrangement, a magnetic field from the AC electric wiring, where power consumption may be relatively large, may be applied to the magnetic detection element in the most efficient manner. Accordingly, since the current flowing through the AC electric wiring to which the current is continuously applied may be reduced, the power consumption of the entire current sensor may be reduced.

The DC electric wiring may be arranged between the magnetic detection element and the AC electric wiring when viewed from the normal direction of the substrate and the direction orthogonal to the direction of the detection axis of the magnetic detection element. With the above configuration, a magnetic field from the AC electric wiring may be applied to the magnetic detection element most efficiently. Accordingly, the current flowing through the DC electric wiring may be reduced.

A cross-sectional area of the AC electric wiring may be larger than a cross-sectional area of the DC electric wiring when viewed from a normal direction of the substrate and a direction orthogonal to the detection axis of the magnetic detection element. With the configuration described above, the power consumption of the AC electric wiring to which the current is continuously applied may be preferentially reduced, and therefore, the power consumption of the entire magnetic sensor may be reduced.

The magnetic sensor may have a plurality of magnetic detection elements and a bridge circuit formed including the plurality of magnetic detection elements. Use of the bridge circuit removes noise applied to the entire magnetic detection element, and therefore, measurement accuracy of the magnetic sensor is improved.

The magnetic sensor may have a soft magnetic material, on the insulating layer, which is disposed more distally from the substrate than the magnetic detection element. Since the magnetic field to be measured may be amplified by the soft magnetic material, measurement accuracy of the magnetic sensor is improved.

In the magnetic sensor, the substrate may be a silicon substrate and the AC electric wiring may be formed by a damascene process. Since a thermal oxide layer is formed on the silicon substrate in the damascene process, insulation between the AC electric wiring and the silicon substrate may be ensured. In addition, according to the damascene process, a deep groove may be formed in the silicon substrate so that an electric wiring having a large cross-sectional area is formed.

DESCRIPTION OF THE PREFERRED EMBODIMENTS

Figure 1A:
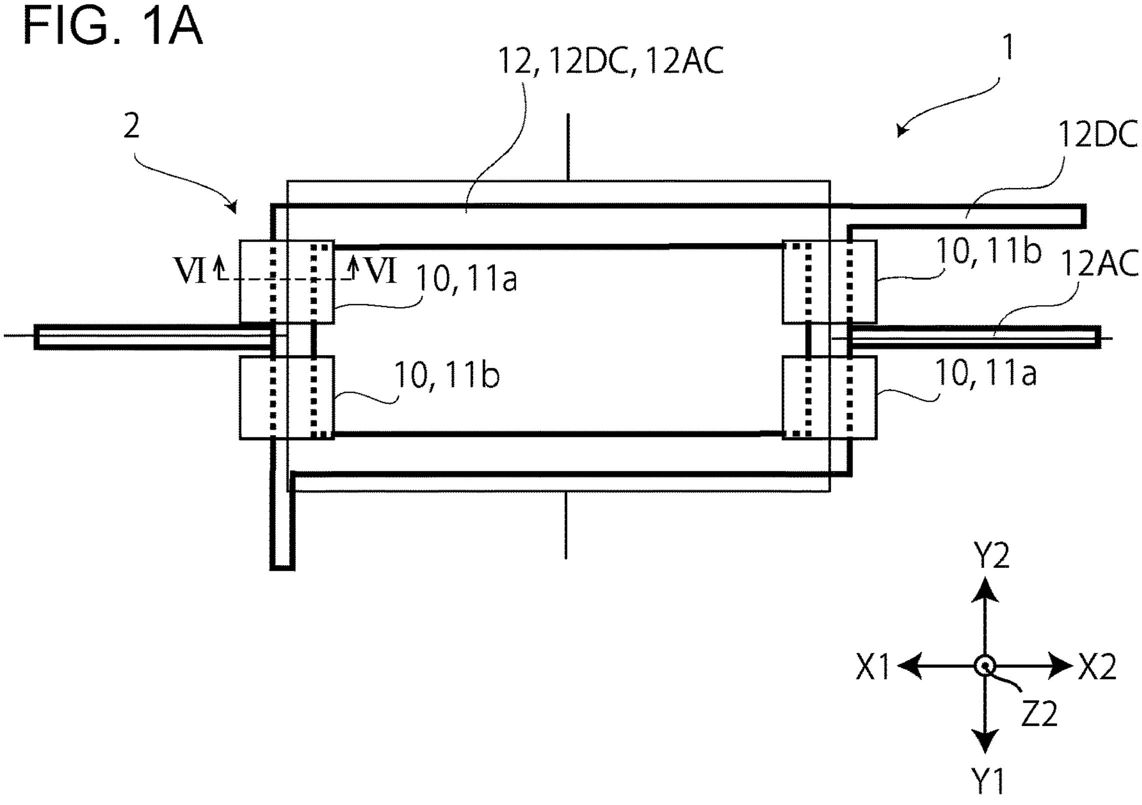
FIG. 1A is a plan view schematically illustrating a magnetic sensor including a bridge circuit.

Embodiments of the present invention will be described hereinafter with reference to the accompanying drawings. In the individual drawings, the same reference numerals are given to the same components, and descriptions thereof are omitted accordingly. Furthermore, coordinates in the individual drawings are for reference only.

First Embodiment

Figure 1B:
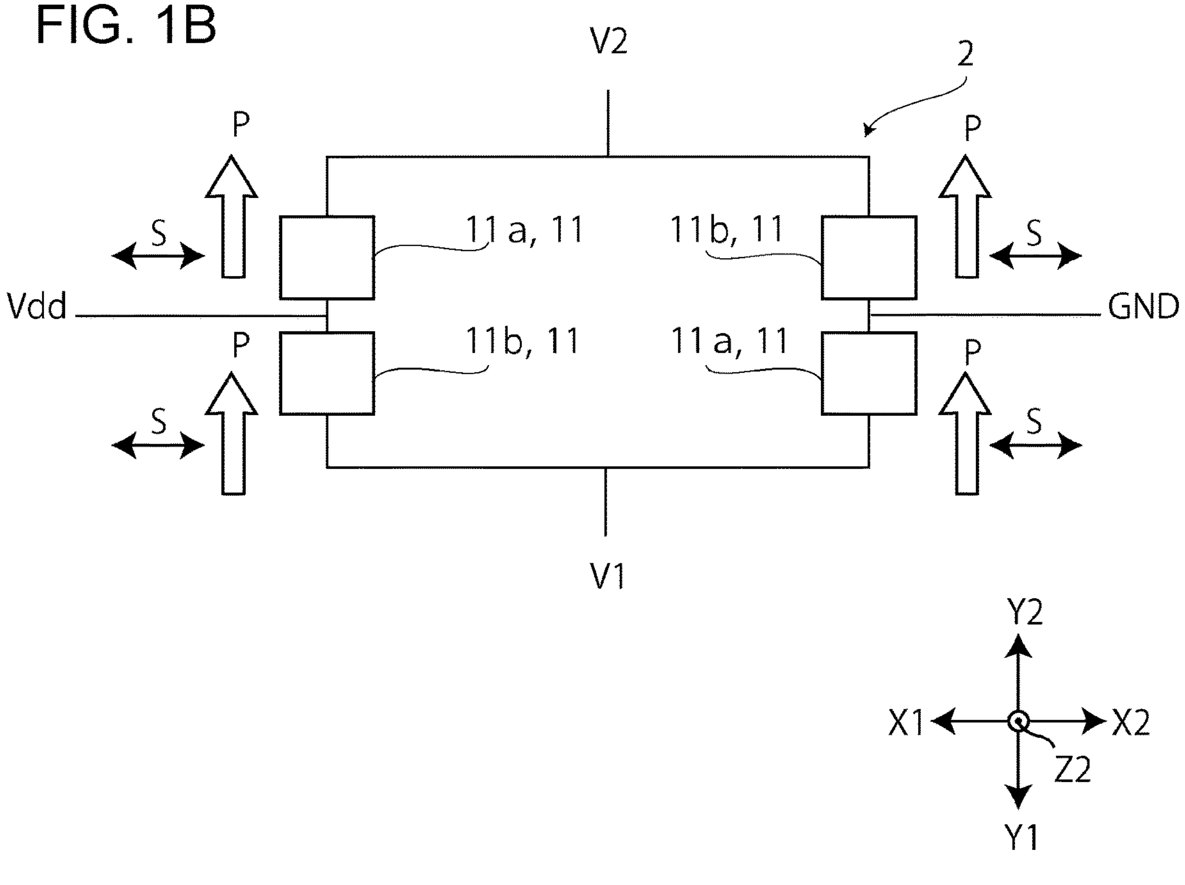
FIG. 1B is a plan view schematically illustrating the bridge circuit included in the magnetic sensor of FIG. 1A.
Figure 1C:
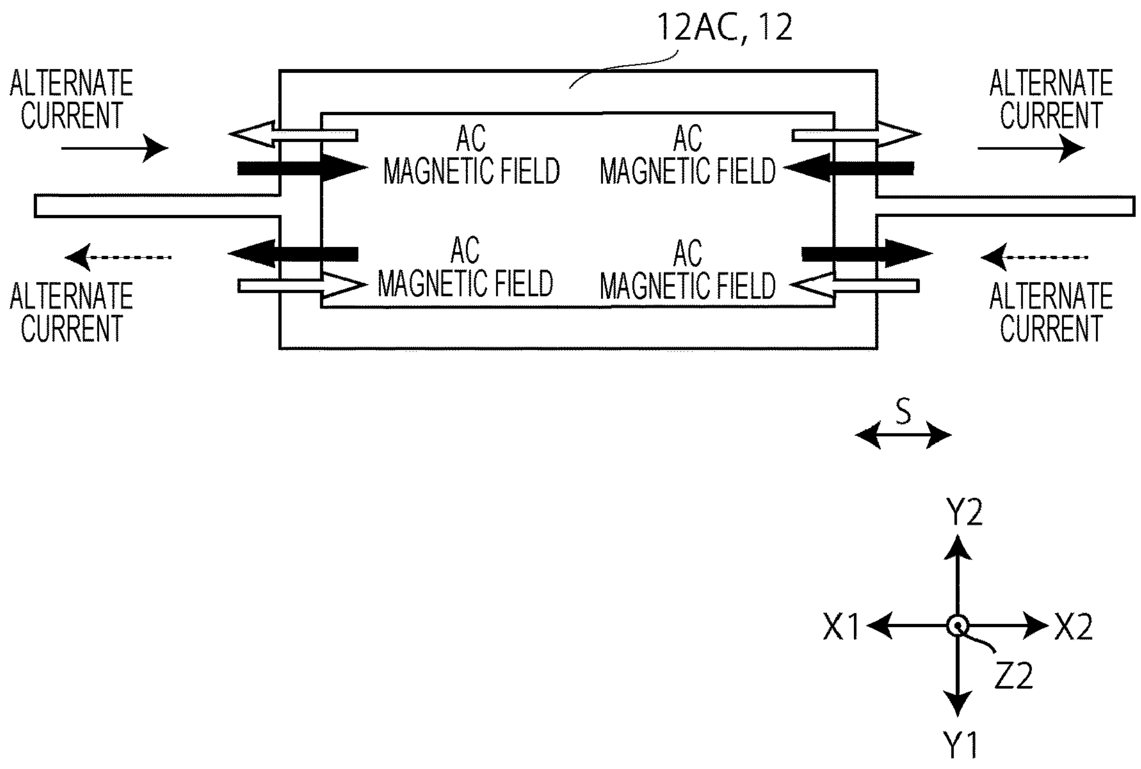
FIG. 1C is a plan view schematically illustrating electric wiring for applying an AC magnetic field included in the magnetic sensor of FIG. 1A.
Figure 1D:
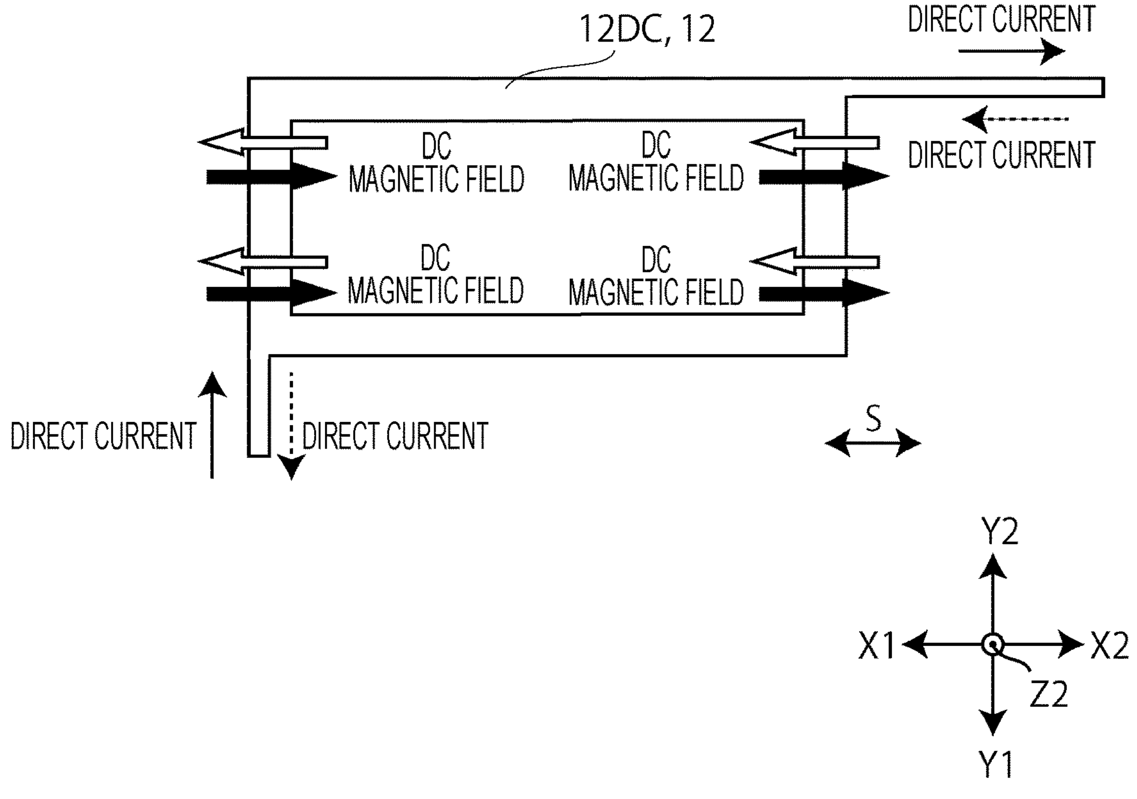
FIG. 1D is a plan view schematically illustrating electric wiring for applying a DC magnetic field included in the magnetic sensor of FIG. 1A.

FIG. 1A is a plan view schematically illustrating a magnetic sensor 1 having a bridge circuit 2 including a plurality of magnetic detection elements 11. FIG. 1B is a plan view schematically illustrating the bridge circuit 2 included in the magnetic sensor 1 of FIG. 1A. FIG. 1C is a plan view schematically illustrating an electric wiring 12AC for applying an AC magnetic field included in the magnetic sensors 1 and 10 of FIG. 1A. FIG. 1D is a plan view schematically illustrating an electric wiring 12DC for applying a DC magnetic field included in the magnetic sensors 1 and 10 of FIG. 1A.

Figure 6:
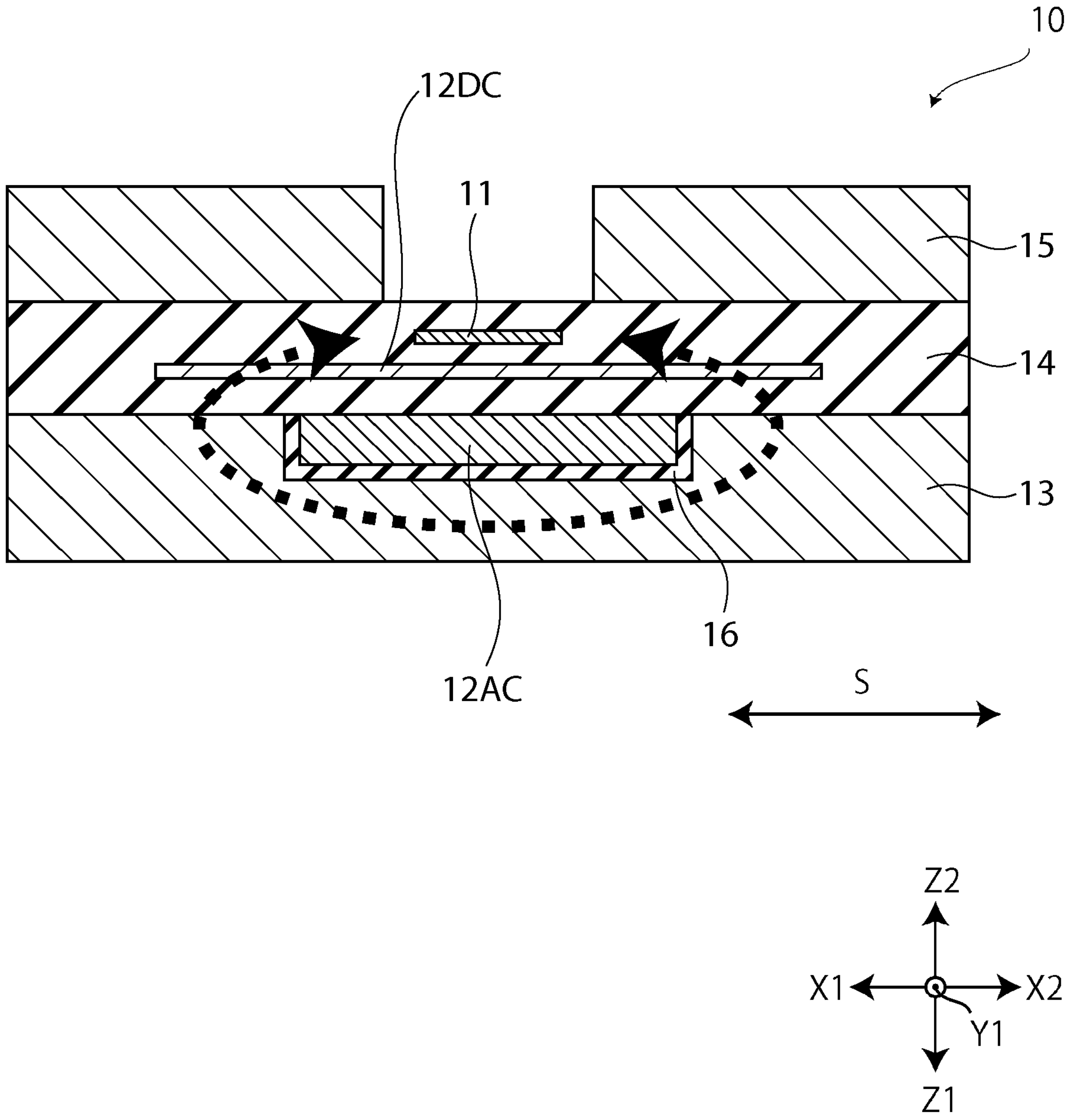
FIG. 6 is a cross-sectional view of a magnetic sensor according to a first embodiment.

For the sake of explanation, soft magnetic materials 15 in the magnetic sensors 10 are omitted in FIGS. 1A and 1B, and individual members are simply and schematically illustrated in FIGS. 1A, 1B, 1C and 1D. Therefore, the magnetic sensors 10 illustrated in FIG. 1A are different from the magnetic sensors 10 illustrated in FIGS. 6 and 10E in illustrated members and the relative positional relationships and sizes of the individual members. In FIG. 1A, electric wirings 12 are illustrated in bold lines to enhance the distinguishability from the bridge circuit 2. In FIG. 1B, the magnetic detection elements 11 are represented larger than a magnetic detection element 11 illustrated in FIG. 10C in order to indicate that the bridge circuit 2 includes four magnetic detection elements 11. Note that, in FIG. 1A, the AC electric wiring 12AC and the DC electric wiring 12DC are collectively illustrated as an electric wiring 12, but as illustrated in FIGS. 1C, 1D, 6 and 10A to 10E, the AC electric wiring 12AC and the DC electric wiring 12DC are configured as different members. Specifically, as illustrated in FIG. 6, in the magnetic sensor 1 according to this embodiment, the AC electric wiring 12AC and the DC electric wiring 12DC are arranged so as to overlap with each other viewed from above (a Z2 side in a Z1-Z2 direction), and the DC electric wiring 12DC is located on an upper side relative to the AC electric wiring 12AC.

The magnetic sensor 1 includes two half-bridge circuits each of which has a magnetic detection element 11*a* and a magnetic detection element 11*b* connected in series. These half-bridge circuits are connected in parallel with respect to a power supply terminal Vdd and constitute the bridge circuit 2. As the magnetic detection elements 11 (magnetic detection element 11*a* and magnetic detection element 11*b*), a giant magnetoresistive effect (GMR) element, a tunnel-type magnetoresistive (TMR) element, or the like is used. A case where the GMR element is used as the magnetic detection elements 11 will be described below.

The GMR element has a fixed magnetic layer, a nonmagnetic layer, and a free magnetic layer stacked on an insulating base layer in this order, and a surface of the free magnetic layer is covered with a protective layer.

The fixed magnetic layer is made of a soft magnetic material, such as a CoFe alloy (cobalt-iron alloy), and has a fixed magnetization direction. In FIG. 1B, the fixed magnetization direction P of the fixed magnetic layer is indicated by arrows. A direction orthogonal to the fixed magnetization direction P (X-axis direction) is a sensitivity axis direction of the individual magnetic detection elements 11. Each of the magnetic detection elements 11 included in the bridge circuit 2 has the same fixed magnetization direction P, and in the examples illustrated in FIGS. 1A and 1B, the fixed magnetization direction P is an upward direction (Y2 direction).

The nonmagnetic layer is made of a nonmagnetic material, such as Cu (copper). The free magnetic layer is made of a soft magnetic material, such as NiFe alloy (nickel-iron alloy). The protective layer covering the free magnetic layer is formed of Ta (tantalum) or the like. A magnetization direction of the free magnetic layer is aligned in the same direction as the fixed magnetization direction P of the fixed magnetic layer. A bias magnetic field may be applied to align the direction of magnetization of the free magnetic layer.

In each of the magnetic detection elements 11, when an external magnetic field is given from an outside, the magnetization direction which is aligned in the same direction as the fixed magnetization direction P of the fixed magnetic layer in the free magnetic layer is tilted toward the X direction. When an angle between a vector of magnetization of the free magnetic layer and the fixed magnetization direction P becomes larger, an electric resistance of the magnetic detection element 11 becomes larger, whereas when the angle between the vector of magnetization of the free magnetic layer and the fixed magnetization direction P becomes smaller, an electric resistance of the magnetic detection element 11 becomes smaller. Therefore, the magnetic detection element 11 shows an even-function type resistance change with respect to the magnetic field in the direction (X-axis direction) of a detection axis S orthogonal to the fixed magnetization direction P of the fixed magnetic layer.

The magnetic sensor 1 includes the electric wiring 12 that functions as a magnetic coil capable of applying a magnetic field to the magnetic detection element 11. The electric wiring 12 is constituted by the AC electric wiring 12AC and the DC electric wiring 12DC. The AC electric wiring 12AC is capable of applying an AC magnetic field to the magnetic detection element 11 in the direction (X-axis direction) of the detection axis S of magnetization of the fixed magnetic layer. The DC electric wiring 12DC is capable of applying a DC magnetic field to the magnetic detection element 11 in the direction of the detection axis S of magnetization of the fixed magnetic layer.

As illustrated in FIG. 1C, the AC electric wiring 12AC has lines connected in parallel, and the lines formed in parallel are arranged along arrangement of the two half bridge circuits constituting the full bridge circuit 2. The lines formed in parallel branch in opposite directions (Y1 side in Y1-Y2 direction and Y2 side in Y1-Y2 direction) in a Y-axis direction from a branch point branching from a common wiring supplying an alternate current to these lines. The branch point is located between the two half bridge circuits when viewed from above (Z2 side in Z1-Z2 direction) as illustrated in FIG. 1A. Therefore, viewed from above, currents in opposite directions always flow in the AC electric wiring 12AC arranged to overlap the magnetic detection element 11*a* and the AC electric wiring 12AC arranged to overlap the magnetic detection element 11*b*.

Therefore, when an alternate current is applied to the AC electric wiring 12AC, AC magnetic fields having opposite phases are applied to the magnetic detection element 11*a* and the magnetic detection element 11*b*, which constitute the bridge circuit 2. The solid and dashed arrows in the figure indicate directions of the alternate current flowing through the AC electric wiring 12AC. Directions of the AC magnetic field generated in the AC electric wiring 12AC by the alternate current in the directions indicated by the solid lines are indicated by black arrows. Direction of the AC magnetic field generated in the AC electric wiring 12AC by the alternate current in the directions indicated by the dashed lines are indicated by white arrows.

As illustrated in FIG. 1D, the DC electric wiring 12DC has lines connected in parallel, and the lines formed in parallel are arranged along arrangement of the two half bridge circuits constituting the full bridge circuit 2. The lines formed in parallel and lines used to connect the lines to each other branch, at a branch point of a common line supplying direct current to these lines, in a direction orthogonal to the X-axis direction and a direction orthogonal to the Y-axis direction. As illustrated in FIG. 1A, the branch point is located between the magnetic detection element 11*a* and the magnetic detection element 11*b* constituting each of the half-bridge circuits when viewed from above (Z2 side in the Z1-Z2 direction). Therefore, viewed from above, a current in the same direction always flows in the DC electric wiring 12DC arranged so as to overlap all the magnetic detection elements 11*a* and 11*b* constituting the full bridge circuit 2.

Accordingly, when a direct current is applied to the DC electric wiring 12DC, a DC magnetic field in the same direction is applied to all the magnetic detection elements 11*a* and 11*b* included in the bridge circuit 2. The solid and dashed arrows in the figure indicate directions of the direct current flowing through the DC electric wiring 12DC. Directions of a DC magnetic field generated in the DC electric wiring 12DC by the direct current in the directions indicated by the solid lines are indicated by black arrows. Directions of a DC magnetic field generated in the DC electric wiring 12DC by the direct current in the directions indicated by the dashed lines are indicated by white arrows.

The magnetic sensor 1 enables detection of a weak magnetic field by applying an AC magnetic field to the magnetic detection elements 11 by the AC electric wiring 12AC. Examples of the weak magnetic field to be detected by the magnetic sensor 1 include a magnetic field emitted from a living body to be measured in medical treatment and a weak magnetic field emitted from various devices. Magnetic sensors with high magnetic resolution are required for measuring electroencephalography in medical forms and for testing various devices, and the magnetic sensor 1 is suitable for these applications.

Figure 2:
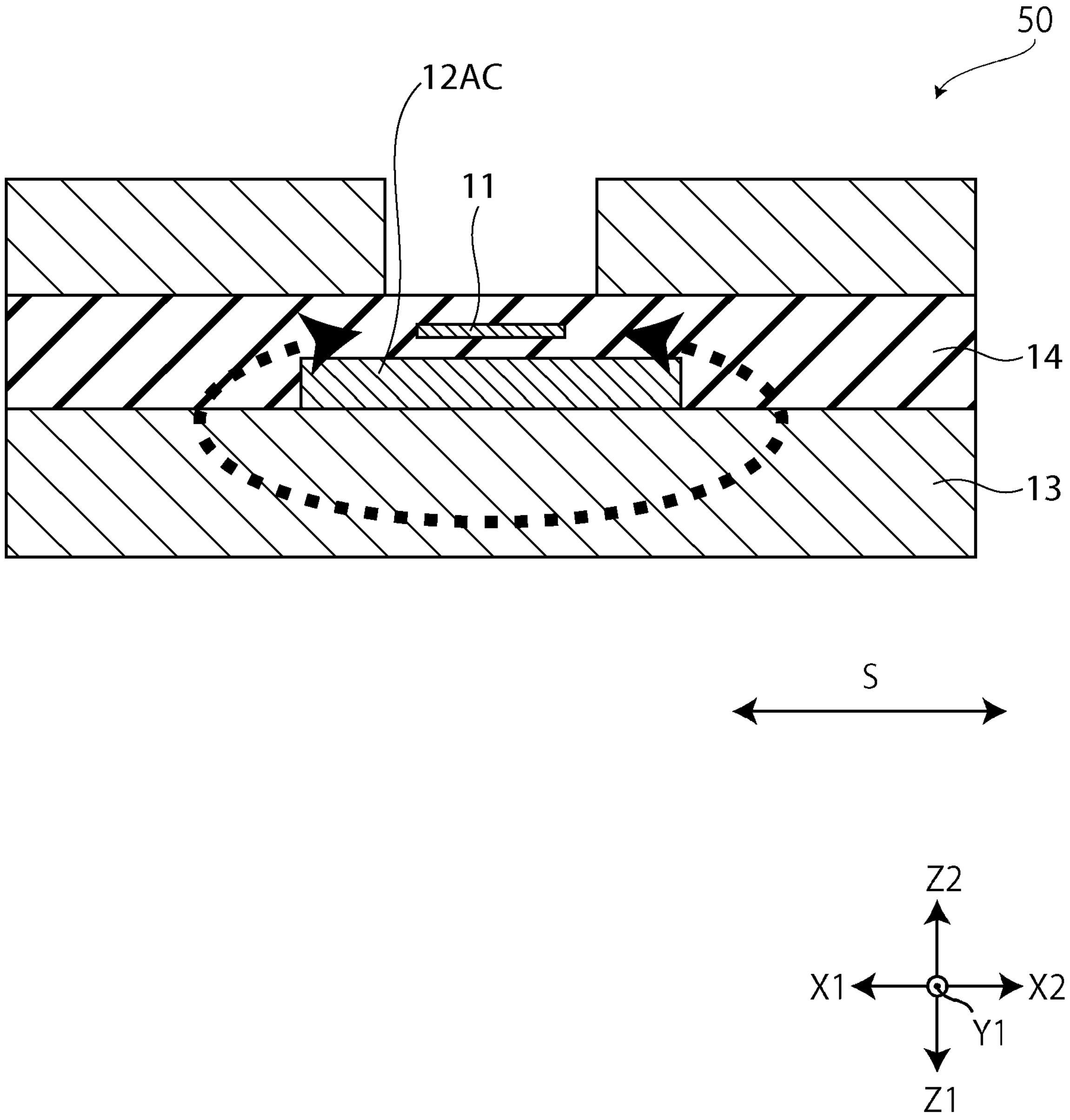
FIG. 2 is a cross-sectional view of a magnetic sensor according to a reference example.

FIG. 2 is a diagram illustrating a magnetic sensor 50 of a reference example including a magnetic detection element 11 and an AC electric wiring 12AC. In a magnetic field detection on an AC magnetic field applied to the magnetic detection element 11, the magnetic detection element 11 having an even function type characteristic in which an output signal characteristic is an even function with respect to a magnetic field having a detection axis S in an in-plane direction of a substrate, and the AC electric wiring 12AC applying an AC magnetic field in a direction orthogonal to the magnetic detection element 11 are basic configurations for detecting magnetism. Here, referring to the magnetic sensor 50 of the reference example, the principle of operation of the magnetic sensors 10 constituting the magnetic sensor 1 will be described hereinafter.

As illustrated in FIG. 2, in the magnetic sensor 50, the AC electric wiring 12AC is installed in a lower layer in an insulating layer 14 formed on a substrate 13 relative to the magnetic detection element 11. The substrate 13 is, for example, a silicon substrate formed of silicon. By applying an alternate current to the AC electric wiring 12AC, an AC magnetic field is applied to the magnetic detection element 11 in a direction of a detection axis S (X-axis direction) orthogonal to a fixed magnetization direction P (Y-axis direction, refer to FIG. 1B) of a fixed magnetic layer (refer to FIG. 1C). A double-headed arrow of a dashed line illustrated in FIGS. 2 and 6 to 9 indicates the AC magnetic field.

Figure 3:
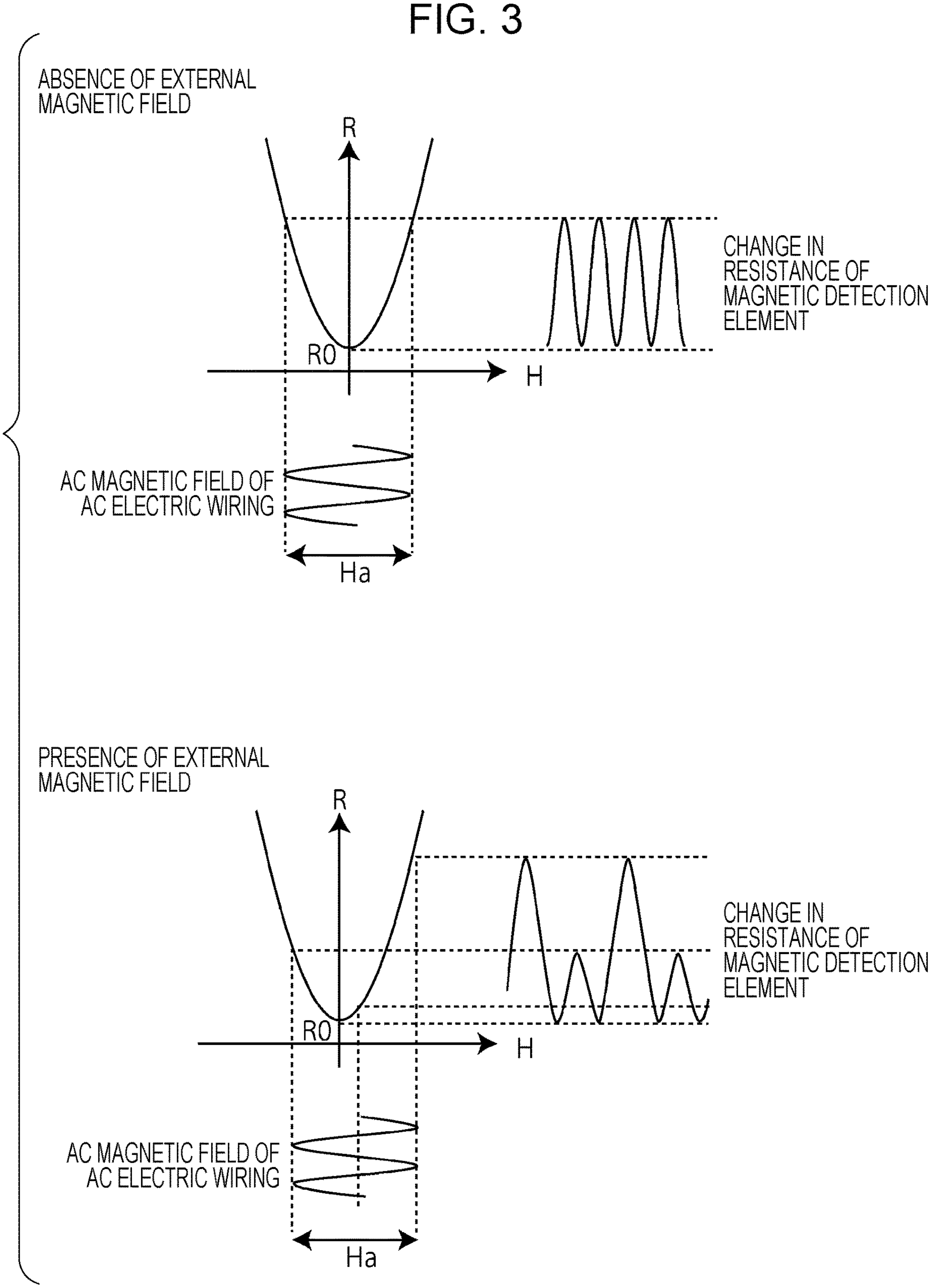
FIG. 3 is a diagram illustrating the measurement principle of the magnetic sensor of the present invention.

FIG. 3 is a diagram explaining the measurement principle of the magnetic sensor 50. The figure shows a change in resistance of the magnetic detection element 11 of the single element magnetic sensor 50.

Figure 4:
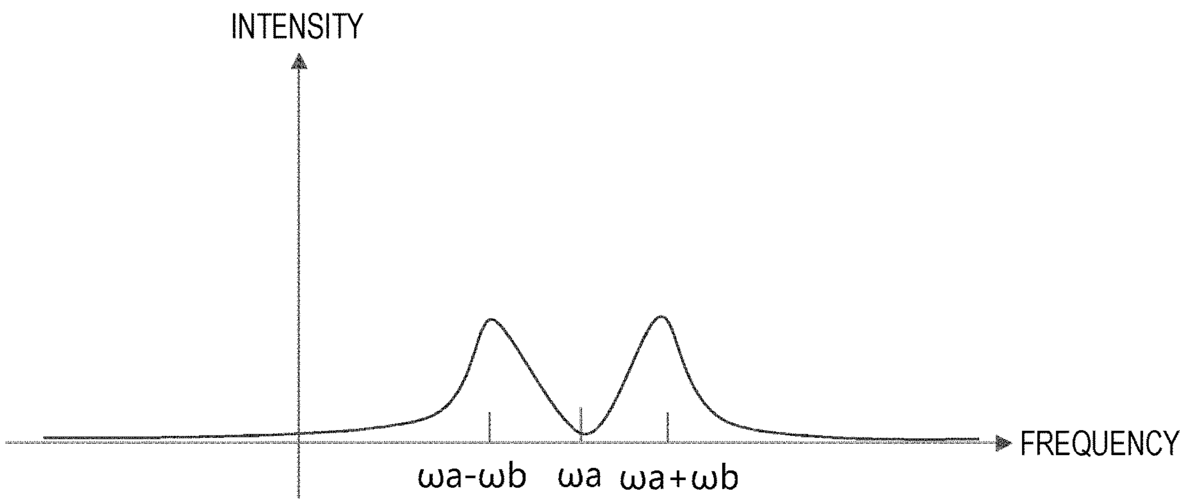
FIG. 4 is a graph obtained by decomposing magnetic field intensity measured by the magnetic sensor by frequency.

FIG. 4 is a graph obtained by decomposing magnetic field intensity measured by the magnetic sensor 50 by frequency. The graph illustrated in the same figure is obtained by performing fast Fourier transform (FFT) on a waveform of a resistance change of the magnetic detection element 11.

In a state in which an external magnetic field is not applied to the magnetic detection element 11 (specifically, magnetic detection element 11*a*), when an AC magnetic field (Ha×sin(ωa×t)) of an amplitude Ha and a frequency wa is added to the magnetic detection element 11*a* by the AC electric wiring 12AC, assuming that a resistance change region of the magnetic detection element 11*a* corresponds to a second order function, a waveform of the resistance change is expressed by the following equation: $dR/dH\times(Ha\times\sin(\omega a\times t))^2=dR/dH\times Ha^2\times(1-\cos(2\omega a\times t))$ Therefore, the waveform of the resistance change of the magnetic detection element 11*a* is output as a wave of twice (2ωa) a frequency of the AC magnetic field applied by the AC electric wiring 12AC as expressed in the following equation:

$$
\begin{aligned}
R &= R_0 + \Delta R \\
&= R_0 + \frac{dR}{dH}(Ha\sin\omega_a t)^2 \\
&= R_0 + \frac{dR}{dH}\left(Ha^2\cdot\left(\frac{1-\cos 2\omega_a t}{2}\right)\right)
\end{aligned}
$$

When an external magnetic field of an alternate current (Hb×sin(ωb×t)) is applied to the AC magnetic field, the waveform of the resistance change of the magnetic detection element 11*a* is expressed by the following equation:

$$
\begin{aligned}
R &= R_0 + \Delta R \\
&= R_0 + \frac{dR}{dH}(Ha\sin\omega_a t + Hb\sin\omega_b t)^2 \\
&= R_0 + \frac{dR}{dH}\left(Ha^2\cdot\left(\frac{1-\cos 2\omega_a t}{2}\right) + Hb^2\cdot\left(\frac{1-\cos 2\omega_b t}{2}\right) - \right. \\
&\quad \left. HaHb(\cos(\omega_a t+\omega_b t) - \cos(\omega_a t-\omega_b t))\right)
\end{aligned}
$$

As illustrated in this equation, a signal indicating the resistance change of the magnetic detection element 11*a* is output as a wave having a component twice the frequency ωa (2ωa) of the applied AC magnetic field and components (ωa+ωb) and (ωa−ωb).

By filtering the output of the signal indicating the resistance change of the magnetic detection element 11*a*, the external magnetic field Hb×sin (ωb×t) may be extracted as a signal of frequencies (ωa+ωb) and (ωa−ωb). That is, the signal obtained by adding the frequency ωb of the external magnetic field to the frequency ωa of the AC magnetic field is obtained as the signal decomposed by the frequency. By detecting the external magnetic field as an AC signal, 1/f noise may be greatly reduced. In this way, magnetic resolution of the magnetic sensor 50 may be improved when a high-frequency region where 1/f noise randomly generated is less is taken as a measurement target.

Here, as illustrated in FIG. 1C, when an alternate current is supplied to the AC electric wiring 12AC, an AC magnetic field having a phase opposite to that of the magnetic detection element 11*a* is applied to the magnetic detection element 11*b* illustrated in FIGS. 1A and 1B. That is, an AC magnetic field represented by (Ha×sin(−ωa×t)=−Ha×sin (ωa×t)) is added to the magnetic detection element 11*b*. Therefore, a resistance R' of the magnetic detection element 11*b* is expressed by the following equation:

$$
\begin{aligned}
R' &= R_0 + \Delta R \\
&= R_0 + \frac{dR}{dH}(-Ha\sin\omega_a t + Hb\sin\omega_b t)^2 \\
&= R_0 + \frac{dR}{dH}\left(Ha^2\cdot\left(\frac{1-\cos 2\omega_a t}{2}\right) + Hb^2\cdot\left(\frac{1-\cos 2\omega_b t}{2}\right) + \right. \\
&\quad \left. HaHb(\cos(\omega_a t+\omega_b t) - \cos(\omega_a t-\omega_b t))\right)
\end{aligned}
$$

Between the equation indicating a change in the resistance R' of the magnetic detection element 11*b* and the equation indicating a change in the resistance R of the magnetic detection element 11*a*, a sign of a term including (ωa+ωb) and a sign of a term including (ωa−ωb) are opposite from each other, and a sign of a term including 2ωa and a sign of a term including 2ωb are not opposite from each other. Therefore, a difference R'−R between the resistance R of the magnetic detection element 11*a* and the resistance R' of the magnetic detection element 11*b* is expressed as follows.

$$R'-R=2\frac{dR}{dH}HaHb(\cos(\omega_a t+\omega_b t)-\cos(\omega_a t-\omega_b t))$$

Therefore, by calculating the difference R'−R, the terms of the frequencies (ωa+ωb) and (ωa−ωb) required for extracting the external magnetic field Hb×sin (ωb×t) may be extracted, and the unrequired terms of 2ωa and 2ωb may be removed. Thus, by applying an AC magnetic field of opposite phases to the magnetic detection element 11*a* and the magnetic detection element 11*b* included in the bridge circuit 2 and using a differential output of the bridge circuit 2 for magnetic detection, the unrequired term 2ωa and 2ωb may be efficiently removed.

As described above, in the magnetic sensor 1 according to this embodiment illustrated in FIGS. 1A to 1D, the AC electric wiring 12AC is connected in parallel, and by applying AC magnetic fields of opposite phases to the magnetic detection element 11*a* and the magnetic detection element 11*a* of the bridge circuit 2, the terms of the frequencies (ωa+ωb) and (ωa−ωb) required for extracting the external magnetic field Hb×Sin(ωb×t) from the resistance R of the magnetic detection element 11*a* and the resistance R' of the magnetic detection element 11*b* may be extracted to improve magnetic detection sensitivity. By improving the magnetic detection sensitivity in this way, for example, it becomes possible to use an amplifier with a high amplification factor.

Figure 5:
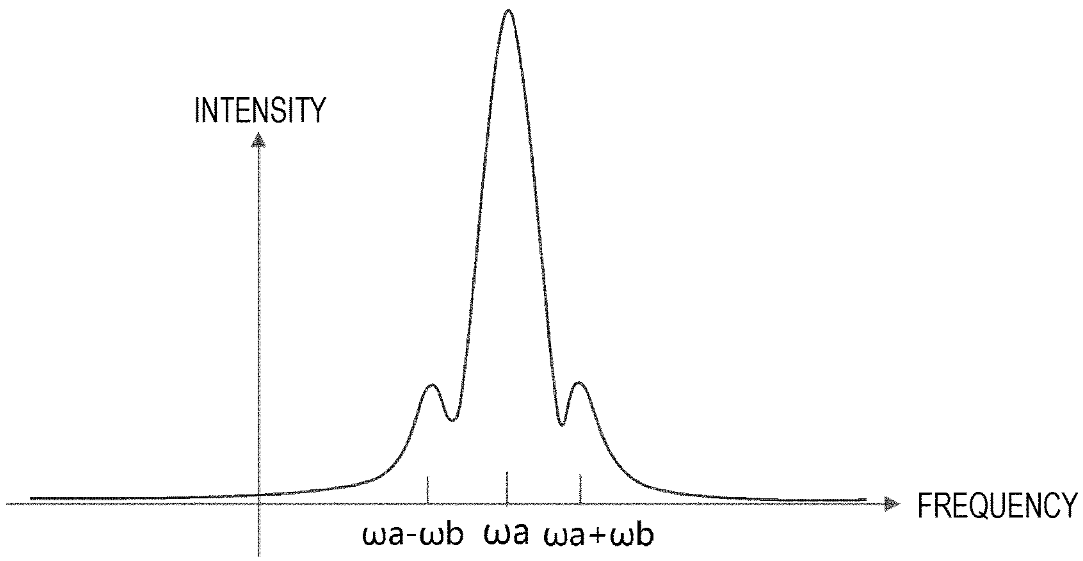
FIG. 5 is a graph obtained by decomposing magnetic field intensity measured by the magnetic sensor by frequency when a disturbance magnetic field is applied.

FIG. 5 is a graph obtained by decomposing magnetic field intensity measured by the magnetic sensor 50 by frequency when a disturbance magnetic field larger than an amplitude of a detected magnetic field is applied.

The measurement principle of the magnetic sensor 50 is as described above, but when a magnetic field is actually measured, a disturbance magnetic field Hi is added to the magnetic sensor. Therefore, an equation indicating a change in a waveform of the resistance change of the magnetic detection element 11 is expressed as follows.

$$\begin{aligned}R&=R_0+\Delta R\\&=R_0+\frac{dR}{dH}(Ha\sin\omega_a t+Hb\sin\omega_b t+Hi)^2\\&=R_0+\frac{dR}{dH}\left(Ha^2\cdot\left(\frac{1-\cos2\omega_a t}{2}\right)+Hb^2\cdot\left(\frac{1-\cos2\omega_b t}{2}\right)+\right.\\&\quad Hi^2-HaHb(\cos(\omega_a t+\omega_b t)-\cos(\omega_a t-\omega_b t))+\\&\quad\left.2Hi(Ha\sin\omega_a t+Hb\sin\omega_b t)\right)\end{aligned}$$

As illustrated in the equation, in the actual measurement, components of ωa and ωb simultaneously exist in a signal obtained by decomposing an output of the waveform by frequency, in addition to (ωa+ωb) and (ωa−ωb). Therefore, when the disturbance magnetic field Hi is larger than the amplitude of the detected magnetic field, tails of a ωa signal becomes wider as illustrated in FIG. 5. Since the signal of the disturbance magnetic field Hi overlaps, detection accuracy of the signals of the frequencies ωa, (ωa+ωb) and (ωa−ωb) is lowered. Therefore, there is a problem, in the magnetic sensor 50 of the reference example including the magnetic detection element 11 and the AC electric wiring 12AC, that an S/N ratio of the detected magnetic field is degraded when a large disturbance magnetic field Hi is added. Therefore, the magnetic sensor 10 of this embodiment cancels the disturbance magnetic field Hi by applying a DC magnetic field to the magnetic detection element 11 by the DC electric wiring 12DC illustrated in FIGS. 1A and 1D.

In addition, in the magnetic sensor 50, as illustrated in FIG. 2, since the magnetic detection element 11 and the AC electric wiring 12AC are both provided in the insulating layer 14, it is difficult to release Joule heat generated in the AC electric wiring 12AC to the substrate 13. Therefore, there is a problem that the sensitivity of the magnetic detection element 11 is lowered due to the heat generation of the AC electric wiring 12AC.

FIG. 6 is a cross-sectional view of the magnetic sensor 10 according to this embodiment, schematically illustrating a cross-sectional configuration of an XZ plane taken along a line VI-VI of FIG. 1A. The magnetic sensor 10 includes the magnetic detection element 11, the AC electric wiring 12AC, the DC electric wiring 12DC, and a soft magnetic material 15. The magnetic detection element 11, the AC electric wiring 12AC and the DC electric wiring 12DC are isolated from one another by the insulating layer 14.

The magnetic detection element 11 is formed through the insulating layer 14 made of an insulating substance on the substrate 13, and has a detection axis S in a direction in the XY plane of the substrate 13 (refer to FIG. 1). The detection axis S is orthogonal to the fixed magnetization direction P of the fixed magnetic layer and corresponds to the X-axis direction. The magnetic detection element 11 has an output signal characteristic of an even function for the magnetic field in the X-axis direction.

The AC electric wiring 12AC applies an AC magnetic field to the magnetic detection element 11 in the direction of the detection axis S of the magnetic detection element 11 by supplying an alternate current. By applying an AC magnetic field to the magnetic detection element 11, a weak magnetic field may be accurately detected by the measurement principle explained with reference to FIGS. 3 to 5.

The AC electric wiring 12AC has a narrower width in the X-axis direction than the DC electric wiring 12DC and is formed wider than the magnetic detection element 11. Thus, a strong AC magnetic field may be generated and a uniform AC magnetic field may be applied to the magnetic detection element 11.

An insulating layer 16 is formed between the AC electric wiring 12AC and the substrate 13. The insulating layer 16 is formed by thermal oxidation performed on a surface of the silicon substrate 13 when the AC electric wiring 12AC is formed, for example, by a damascene process.

The AC electric wiring 12AC of the magnetic sensor 10 is formed in the substrate 13 in an embedding manner. Although, in FIG. 6, the entire AC electric wiring 12AC is buried in the substrate 13, a portion of the AC electric wiring 12AC may be buried in the substrate 13. By burying at least a portion of the AC electric wiring 12AC in the substrate 13, heat of the AC electric wiring 12AC may be efficiently dissipated to the substrate 13, and the AC electric wiring 12AC may be installed near the magnetic detection element 11. Since the AC electric wiring 12AC having a larger cross-sectional area may be formed when compared with a case where the AC electric wiring 12AC is formed in the insulating layer 14, the resistivity of the AC electric wiring 12AC may be reduced. Therefore, the AC magnetic field applied to the magnetic detection element 11 may be increased without increasing an amount of alternate current flowing through the AC electric wiring 12AC.

In addition, by embedding the AC electric wiring 12AC in the substrate 13 and forming the magnetic detection element 11, the DC electric wiring 12DC, the insulating layer 14 and the like thereon, sections constituting the magnetic sensor 10 may be formed with higher accuracy when compared with the magnetic sensor 50 including the AC electric wiring 12AC in the insulating layer 14 (refer to FIG. 2).

The magnetic sensor 10 includes the DC electric wiring 12DC capable of applying a DC magnetic field to the magnetic detection element 11 in addition to the AC electric wiring 12AC. By applying a DC magnetic field for canceling the disturbance magnetic field to the magnetic detection element 11 by the DC electric wiring 12DC, degradation of the S/N ratio of a detected magnetic field due to influence of the external magnetic field may be suppressed.

The DC electric wiring 12DC has a wider width in the X-axis direction than the magnetic detection element 11 and the AC electric wiring 12AC. Thus, a cross-sectional area of the DC electric wiring 12DC may be increased to lower resistance. By increasing the width of the DC electric wiring 12DC, the cross-sectional area of the DC electric wiring 12DC may become larger, and a thickness may become smaller than that of the DC electric wiring 12DC having the same cross-sectional area but a narrower width. Therefore, a distance between the AC electric wiring 12AC and the magnetic detection element 11 is reduced, so that an AC magnetic field may be efficiently applied from the AC electric wiring 12AC to the magnetic detection element 11. From the viewpoint of uniform application of a DC magnetic field to the magnetic detection element 11, a width in the X-axis direction of the DC electric wiring 12DC is preferably about twice that of the magnetic detection element 11 (for example, 1.5 times or more and 2.5 times or less).

In the magnetic sensor 1 illustrated in FIG. 1A having the bridge circuit 2 including the plurality of magnetic detection elements 11, the DC electric wiring 12DC applies a DC magnetic field in one direction to the plurality of magnetic detection elements 11 in order to cancel the disturbance magnetic field. The direction of the DC magnetic field applied by the DC electric wiring 12DC is the same for the magnetic detection elements 11*a* and 11*b*.

The control of the current to be applied to the DC electric wiring 12DC for applying a DC magnetic field to the magnetic detection element 11 is performed by applying a direct current that generates a DC magnetic field that cancels out the measured disturbance magnetic field, and feeding back to the direct current a measured value of magnetic field strength measured by the magnetic sensor in a state where the direct current is applied. The general methods may be used for the feedback control.

The DC electric wiring 12DC of the magnetic sensor 10 is arranged between the magnetic detection element 11 and the AC electric wiring 12AC when viewed from a direction (Y-axis direction) orthogonal to a normal direction (Z-axis direction) of the substrate 13 and a direction (X-axis direction) of the detection axis S of the magnetic detection element 11.

By arranging the DC electric wiring 12DC between the magnetic detection element 11 and the AC electric wiring 12AC, the cross-sectional area of the AC electric wiring 12AC may be increased without considering the arrangement of the DC electric wiring 12DC, and the magnetic sensor 10 easily obtains effects of efficient heat radiation and effects of reduction of the resistivity.

Furthermore, in the case of this arrangement, since the distance between the DC electric wiring 12DC and the magnetic detection element 11 is relatively small, the magnetic field applied to the magnetic detection element 11 may be increased without increasing the amount of current supplied to the DC electric wiring 12DC. This shortening of the distance of the DC electric wiring 12DC may contribute to enhancement of responsiveness as the magnetic sensor 10. Note that, from the viewpoint of ease of manufacturing, it may be preferable that the DC electric wiring 12DC does not have a portion buried in the substrate 13.

A cross-sectional area of the AC electric wiring 12AC of the magnetic sensor 10 is larger than a cross-sectional area of the DC electric wiring 12DC when viewed from a direction orthogonal to the normal direction (Z-axis direction) of the substrate 13 and a direction (Y-axis direction) orthogonal to the direction of the detection axis S (X-axis direction) of the magnetic detection element 11.

Since the current application to the AC electric wiring 12AC is continuously performed, it may be preferable to preferentially reduce the power consumption of the AC electric wiring 12AC from the viewpoint of reduction of overall power consumption. Therefore, when the cross-sectional area of the AC electric wiring 12AC is formed larger than the cross-sectional area of the DC electric wiring 12DC, the resistivity of the AC electric wiring 12AC may be lower than the resistivity of the DC electric wiring 12DC, and the power consumption of the AC electric wiring 12AC may be efficiently reduced.

The magnetic sensor 10 has the soft magnetic material 15, on the insulating layer 14, which is provided more distally from the substrate 13 than the magnetic detection element 11. A magnetic field to be measured may be amplified and measurement accuracy of the magnetic sensor 10 may be improved by the soft magnetic material 15 composed of an MFC (Magnetic Flux Concentrator) or the like.

Since the magnetic sensor 10 has the AC electric wiring 12AC embedded in the substrate 13, the AC electric wiring 12AC may be thickly formed and the DC electric wiring 12DC may be formed in a layer (layer) above the AC electric wiring 12AC. Therefore, power consumption can be suppressed, while heat generation of the magnetic sensor 10 is suppressed.

Moreover, the AC electric wiring 12AC may be formed in a groove formed in the substrate 13, so that the cross-sectional area of the AC electric wiring 12AC is increased. Therefore, deterioration in sensitivity of the magnetic detection element 11 due to heat generation is suppressed, and in addition, power consumption of the magnetic sensor 10 may be suppressed and a total film thickness may also be suppressed.

Figure 7:
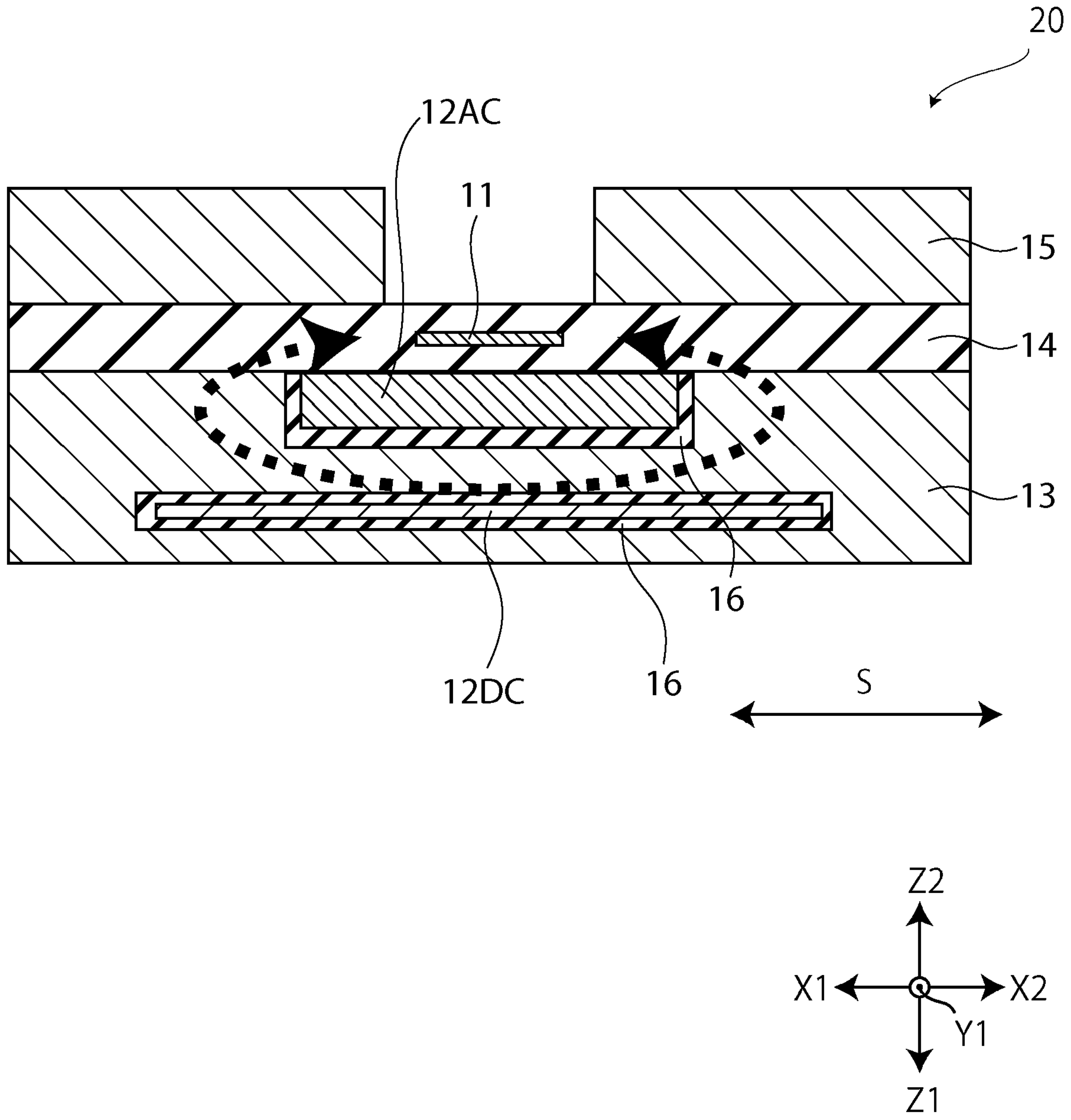
FIG. 7 is a cross-sectional view of a magnetic sensor according to a modification of the first embodiment.

FIG. 7 is a cross-sectional view of a magnetic sensor 20 according to a modification of the magnetic sensor 10 of the first embodiment. The magnetic sensor 20 is different from the magnetic sensor 10 in a configuration in which a DC electric wiring 12DC is embedded in a substrate 13. An insulating layer 16 is disposed between the DC electric wiring 12DC and the substrate 13.

Since at least a portion of the DC electric wiring 12DC is formed by being buried in the substrate 13, and the DC electric wiring 12DC is formed so as to have a portion buried in the substrate 13, as in the case of an AC electric wiring 12AC, effects of efficient heat dissipation, resistivity reduction, and distance reduction may be obtained also for the DC electric wiring 12DC. Therefore, power consumption of both the AC electric wiring 12AC and DC electric wiring 12DC may be reduced.

The AC electric wiring 12AC is arranged between a magnetic detection element 11 and the DC electric wiring 12DC when viewed from a direction orthogonal to a normal direction (Z-axis direction) of the substrate 13 and a direction (Y-axis direction) orthogonal to a direction (X-axis direction) of a detection axis S of the magnetic detection element 11. Since the DC electric wiring 12DC is configured so that a distance is increased from the magnetic detection element 11, the power consumption of the DC electric wiring 12DC increases, but the power consumption of the AC electric wiring 12AC may be reduced. Therefore, as a whole, power consumption of the magnetic sensor 20 may be suppressed.

Second Embodiment

Figure 8:
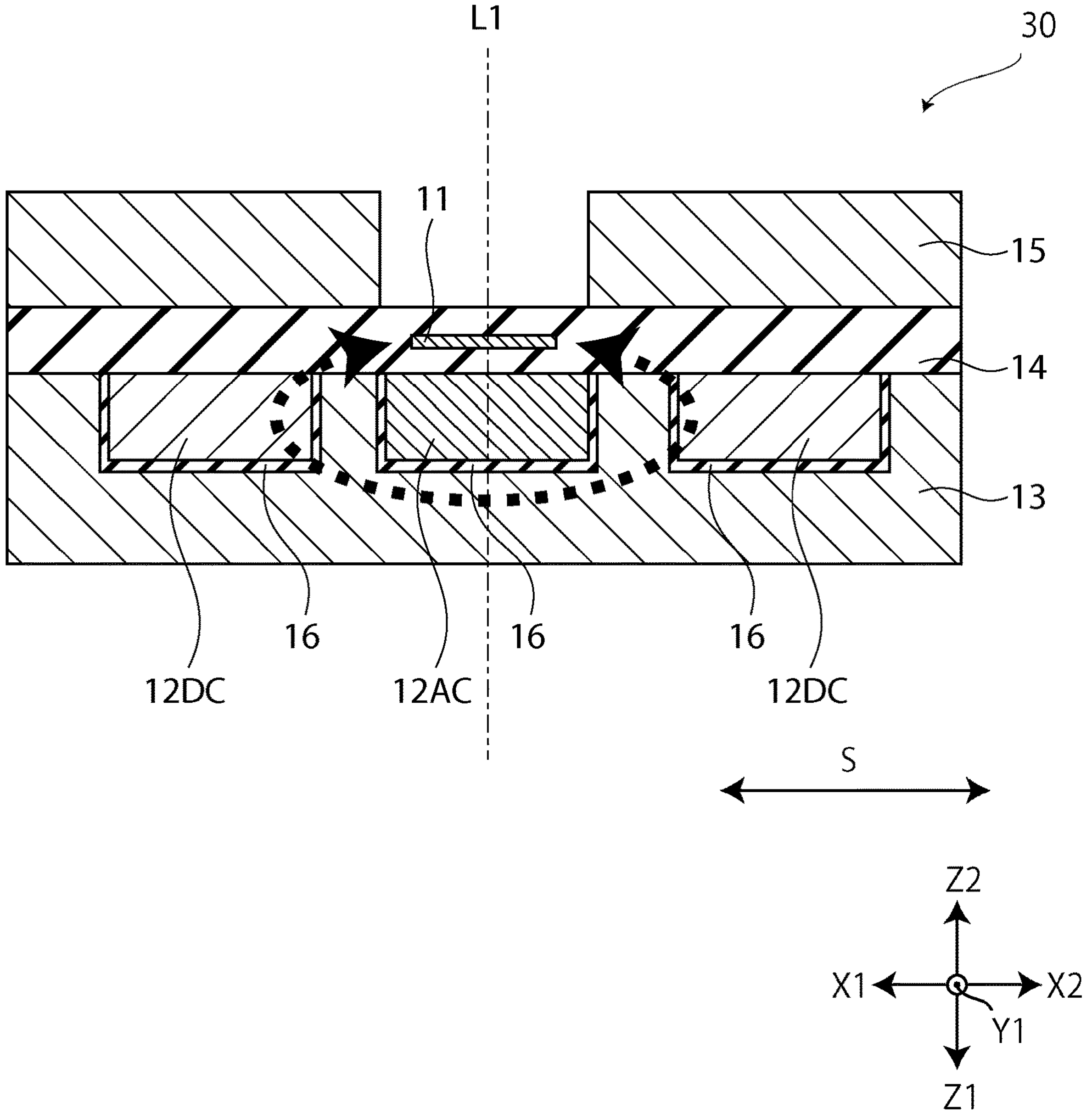
FIG. 8 is a cross-sectional view of a magnetic sensor according to a second embodiment.

FIG. 8 is a cross-sectional view of a magnetic sensor 30 according to this embodiment. As illustrated in the figure, the magnetic sensor 30 is formed such that DC electric wirings 12DC are embedded in a substrate 13. The DC electric wirings 12DC are formed in parallel with an AC electric wiring 12AC when viewed from a direction orthogonal to a normal direction (Z-axis direction) of the substrate 13 and a direction (Y-axis direction) orthogonal to a direction of a detection axis S (X-axis direction) of the magnetic detection element 11. Note that, in FIG. 8, the entire DC electric wirings 12DC are buried in the substrate 13, but a portion thereof may be buried.

In the magnetic sensor 30, one DC electric wiring 12DC is arranged on each side in the X-axis direction with respect to the AC electric wiring 12AC. The DC electric wiring 12DC may be disposed only on one side of the AC electric wiring 12AC, but it is preferable to provide one on each side from the viewpoint of uniformizing a DC magnetic field to be applied from the DC electric wirings 12DC to the magnetic detection element 11. From a similar viewpoint, it is more preferable that the two DC electric wirings 12DC are arranged in a linear symmetry with respect to s center line L1 which is parallel to the Z axis and which extends through a center of the magnetic detection element 11 when viewed from the Y-axis direction.

By arranging the DC electric wirings 12DC and the AC electric wiring 12AC in parallel when viewed from an in-plane direction of the substrate 13, at least portions of the two types of electric wiring may be manufactured in the same wiring formation process, and accordingly, manufacturing efficiency is improved.

The AC electric wiring 12AC is disposed to have a portion overlapped with the magnetic detection element 11 when viewed from the normal direction (Z-axis direction) of the substrate 13. Since the AC electric wiring 12AC is disposed closer to the magnetic detection element 11 than the DC electric wirings 12DC in parallel arrangement, a magnetic field from the AC electric wiring 12AC, where power consumption may be relatively large, may be applied to the magnetic detection element 11 in the most efficient manner.

Figure 9:
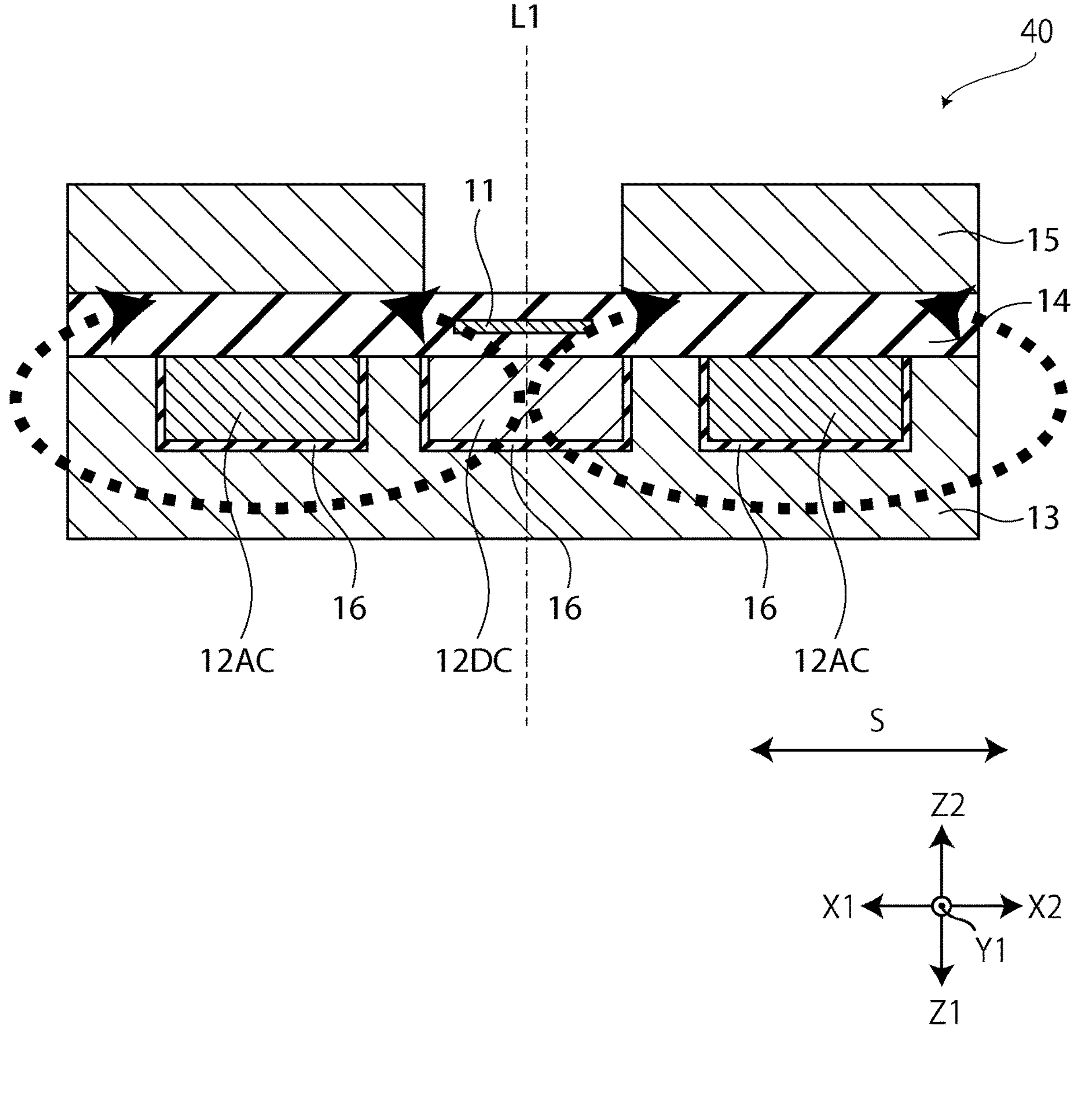
FIG. 9 is a cross-sectional view of a magnetic sensor according to a modification of the second embodiment.

FIG. 9 is a cross-sectional view of a magnetic sensor 40 according to a modification of the magnetic sensor 30 of this embodiment. The magnetic sensor 40 is different from the magnetic sensor 30 in a configuration in which positions of a DC electric wiring 12DC and AC electric wirings 12AC are exchanged.

When viewed from a Y-axis direction, the magnetic sensor 40 has two AC electric wirings 12AC arranged one on each side in an X-axis direction with respect to the DC electric wiring 12DC. The two AC electric wirings 12AC are arranged linearly symmetrically with respect to a center line L1 parallel to the Z-axis direction through a center of the magnetic detection element 11 when viewed from the Y-axis direction. In the two AC electric wirings 12AC, an alternate current applying an AC magnetic field of the same phase flows to magnetic detection elements 11 is supplied.

Figure 10A:
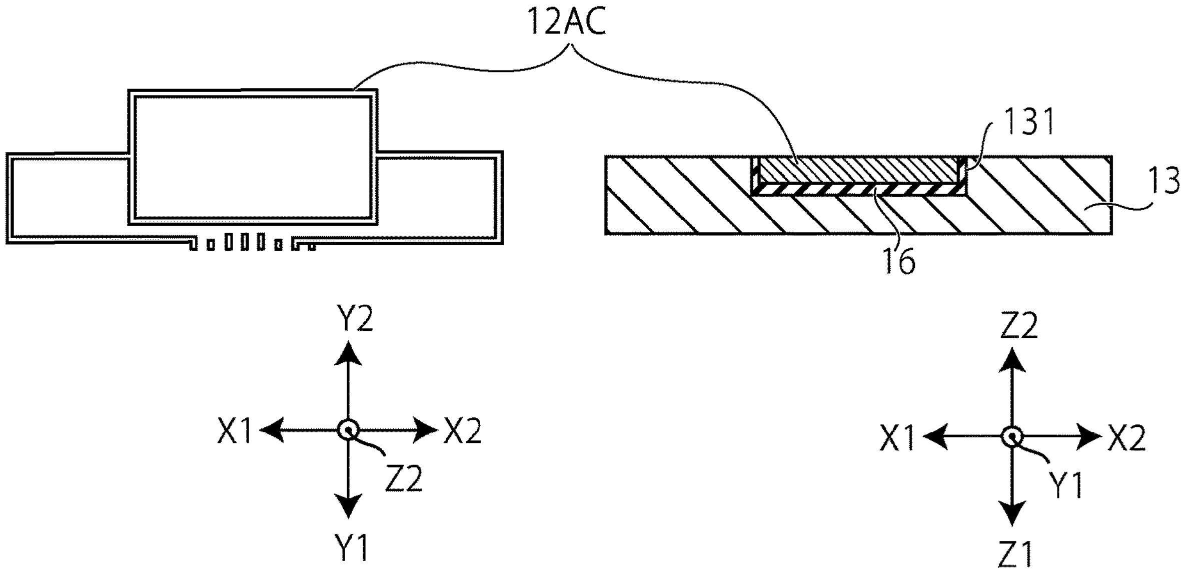
FIG. 10A is a diagram schematically illustrating a method for manufacturing the magnetic sensor according to the present invention.
Figure 10B:
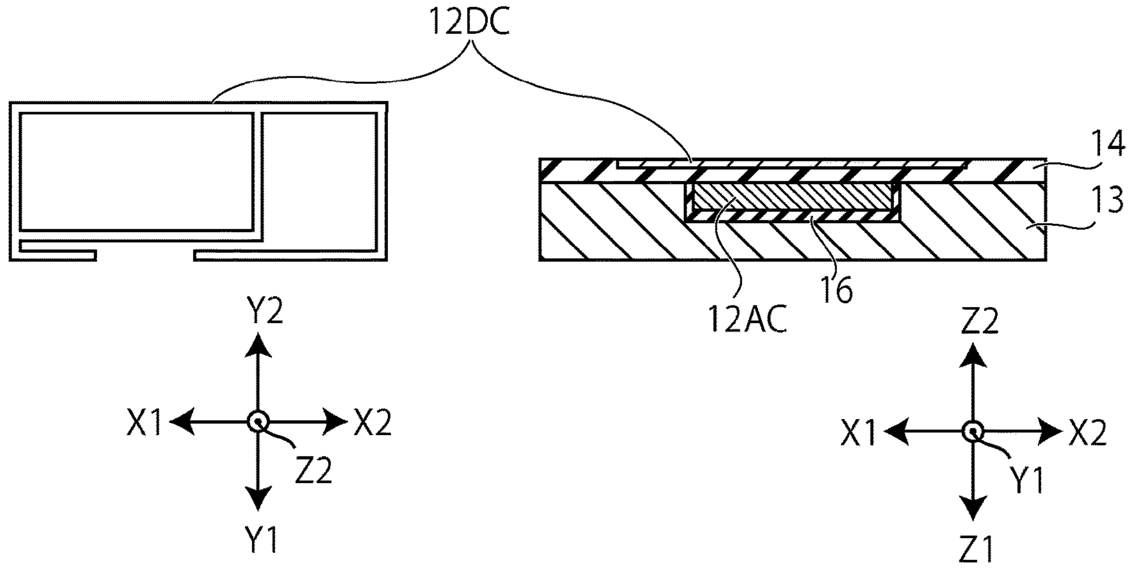
FIG. 10B is a diagram schematically illustrating the method for manufacturing the magnetic sensor according to the present invention.
Figure 10C:
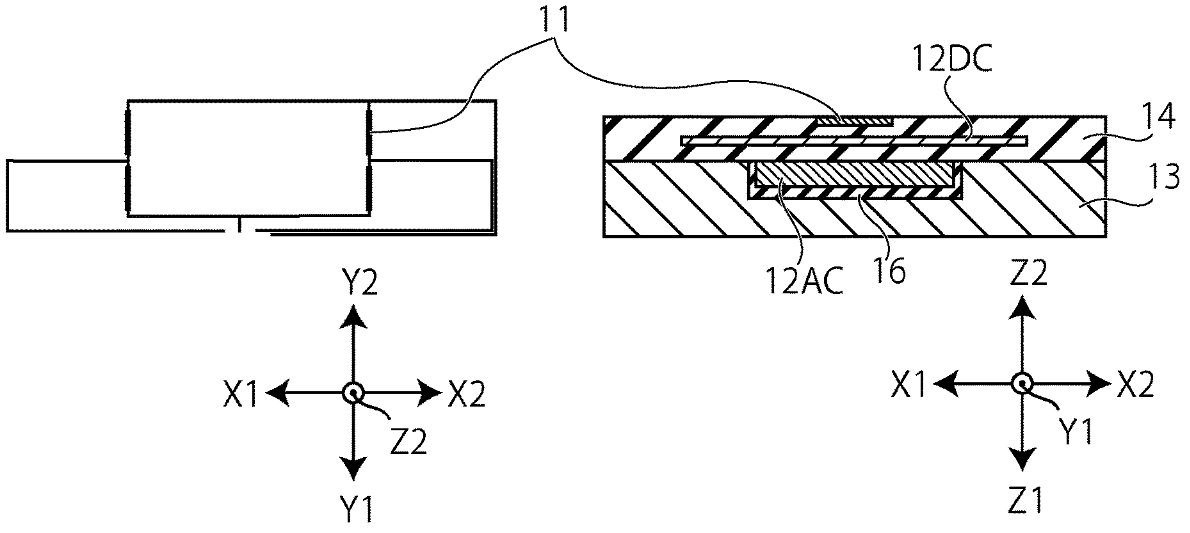
FIG. 10C is a diagram schematically illustrating the method for manufacturing the magnetic sensor according to the present invention.
Figure 10D:
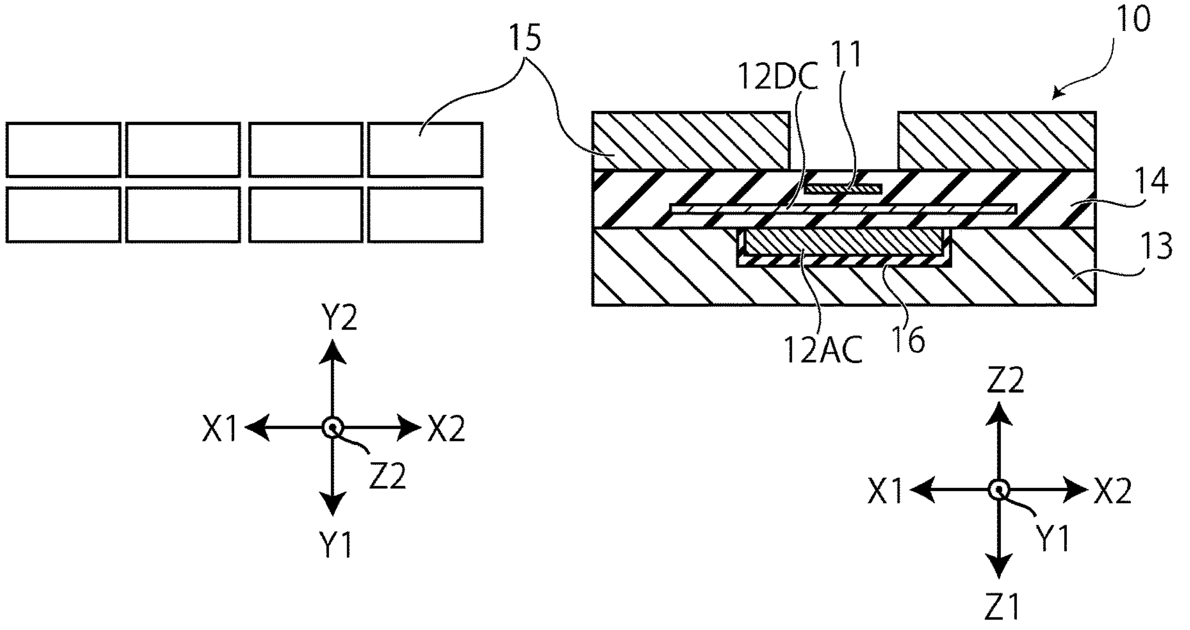
FIG. 10D is a diagram schematically illustrating the method for manufacturing the magnetic sensor according to the present invention.
Figure 10E:
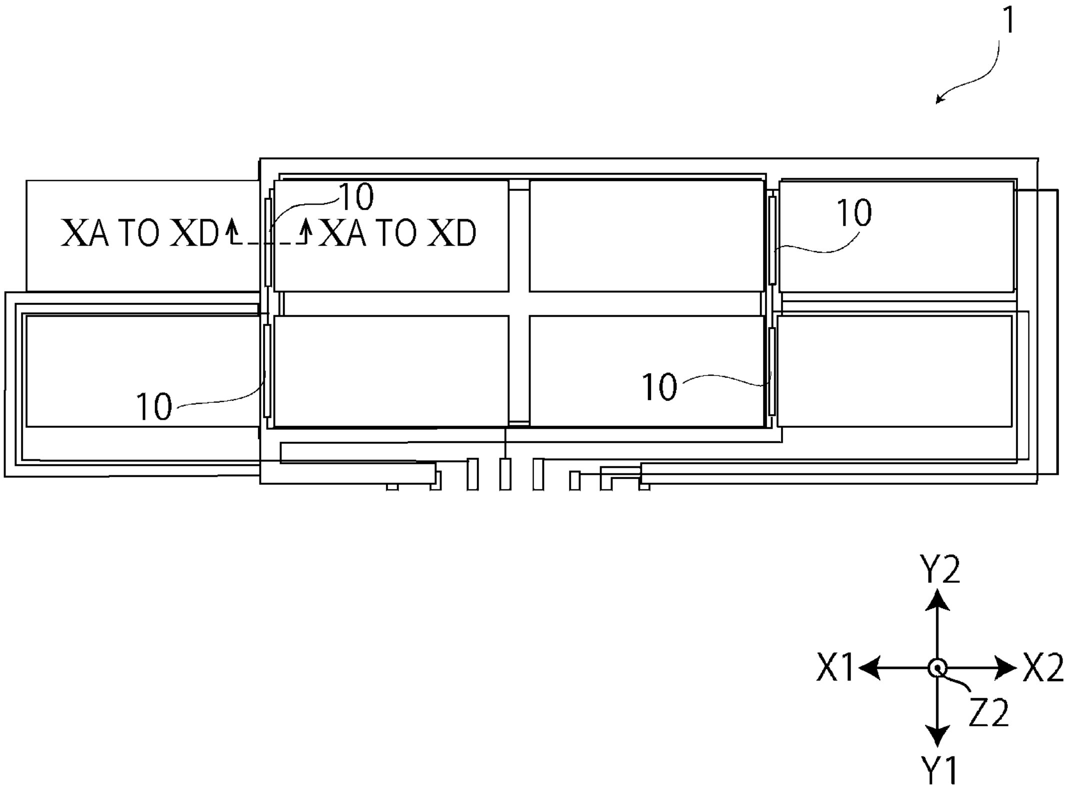
FIG. 10E is a plan view of the magnetic sensor manufactured by the manufacturing method of FIGS. 10A to 10D.

FIGS. 10A to 10D are diagrams schematically illustrating a method for manufacturing a magnetic sensor of the present invention, and FIG. 10E is a plan view illustrating a magnetic sensor manufactured by the manufacturing method. In FIGS. 10A to 10D, the main members formed in individual processes in plan views are illustrated on left sides. Cross-sectional views on right sides show cross sections taken along a line XA to XD-XA to XD of FIG. 10E step by step after individual members are formed in corresponding processes.

As illustrated in FIG. 10A, an AC electric wiring 12AC is formed on a substrate 13 made of a silicon substrate by a damascene process. A groove 131 corresponding to a shape of the AC electric wiring 12AC is formed in the substrate 13, and the AC electric wiring 12AC is formed in the substrate 13 where the groove 131 is formed. A layer for the AC electric wiring 12AC including the AC electric wiring 12AC may be formed on a surface of the substrate 13 in which the groove 131 is formed, and a portion other than the AC electric wiring 12AC may be scraped from the surface to form the AC electric wiring 12AC.

The insulating layer 16 is formed by thermally oxidizing the surface of the substrate 13 before coating the layer for the AC electric wiring 12AC, thereby improving insulation resistance of the AC electric wiring 12AC. In addition, the damascene process is suitable for forming the deep groove 131 in the substrate 13 and forming the AC electric wiring 12AC having a large cross-sectional area.

In the magnetic sensor 10 described in FIGS. 10A to 10E, the AC electric wiring 12AC is formed by the damascene process. However, in the magnetic sensors 20, 30, and 40, members other than the AC electric wiring 12AC are also formed by the damascene process.

In the magnetic sensor 20 (refer to FIG. 7), the AC electric wiring 12AC and the DC electric wiring 12DC are formed by the damascene process. In the magnetic sensors 30 and 40 (refer to FIGS. 8 and 9), the AC electric wirings 12AC and the DC electric wirings 12DC are formed by the damascene process. Since the AC electric wiring 12AC and the DC electric wiring 12DC are arranged in parallel, at least a portion may be simultaneously formed.

Subsequently, the insulating layer 14 and the DC electric wiring 12DC illustrated in FIG. 10B, the insulating layer 14 and the magnetic detection element 11 illustrated in FIG. 10C, the insulating layer 14 and the soft magnetic material 15 illustrated in FIG. 10D are successively formed. In the process illustrated in FIGS. 10B to 10D, the individual members may be formed by a sputtering process or the like. By the individual processes, the magnetic sensor 1 with the magnetic sensors 10 illustrated in FIG. 10E may be manufactured.

EXAMPLES

In the magnetic sensor 1 including the bridge circuit 2 illustrated in FIGS. 1A to 1D, a magnitude of the alternate current (drive current) of the AC electric wiring 12AC and a magnitude of the direct current (cancellation current) of the DC electric wiring 12DC required for generating a magnetic field Hs and a magnetic field Hi' to be applied to the magnetic detection element 11 are calculated.

Figure 11A:
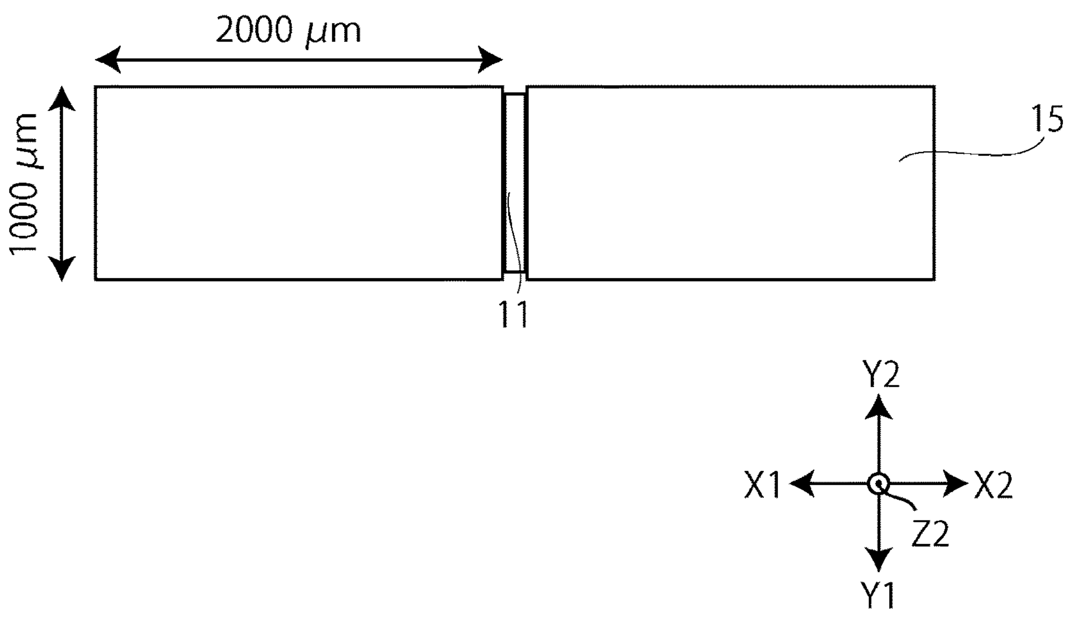
FIG. 11A is a plan view illustrating a configuration of a soft magnetic material of a magnetic sensor according to an example.
Figure 11B:
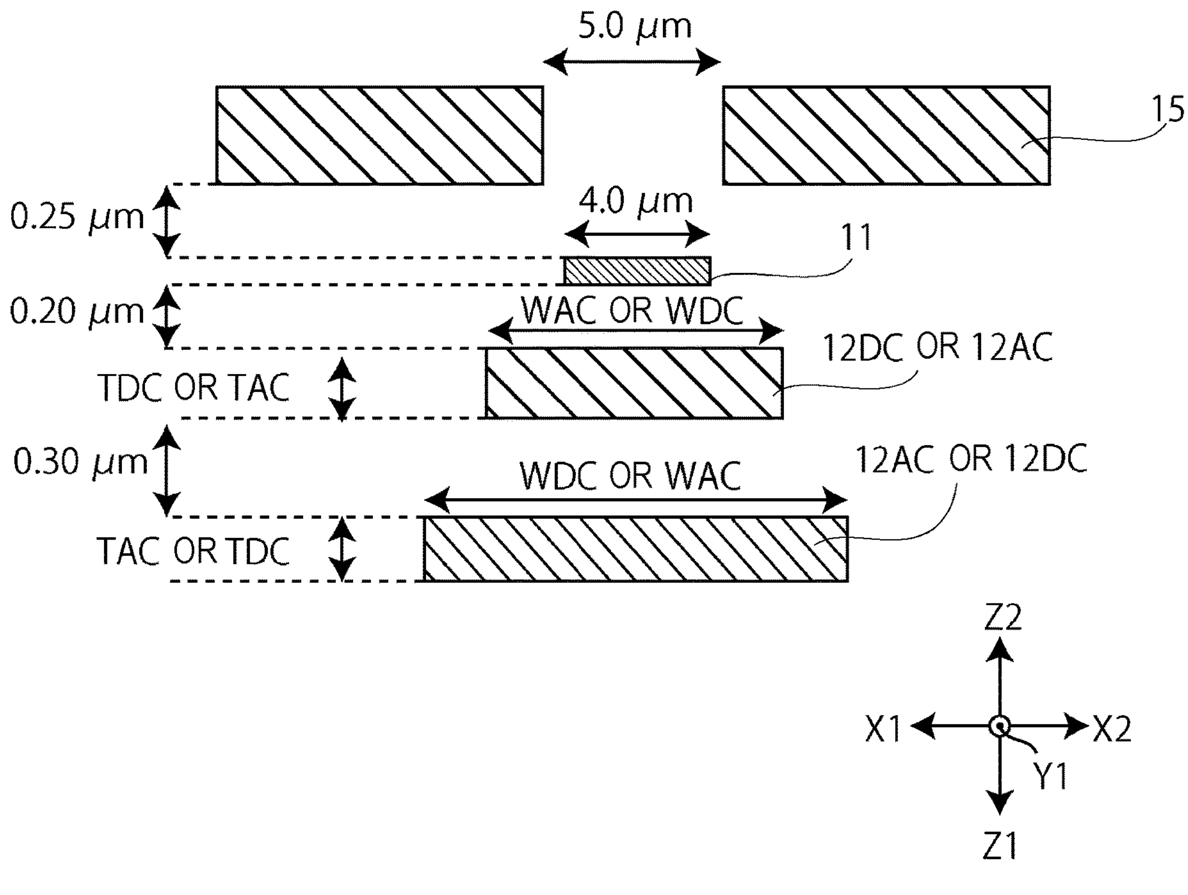
FIG. 11B is a cross-sectional view illustrating configurations of sections of the magnetic sensor according to the example.
Figure 11C:
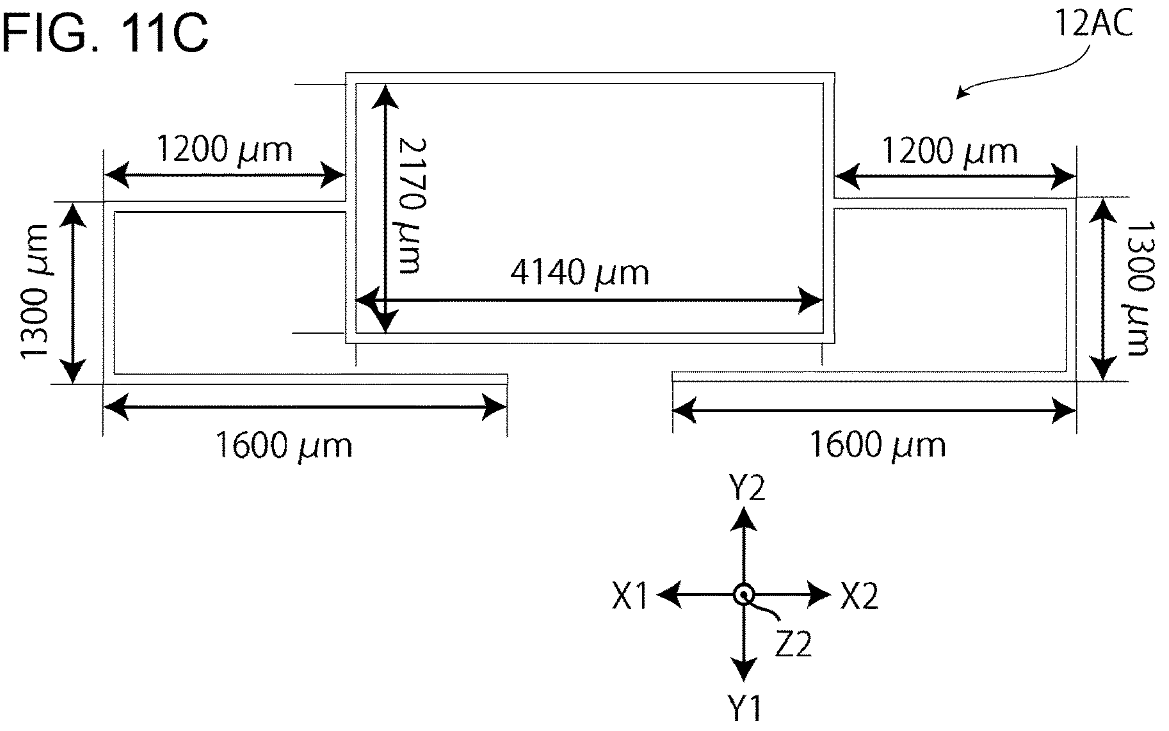
FIG. 11C is a plan view illustrating a configuration of an AC electric wiring of the magnetic sensor according to the example.
Figure 11D:
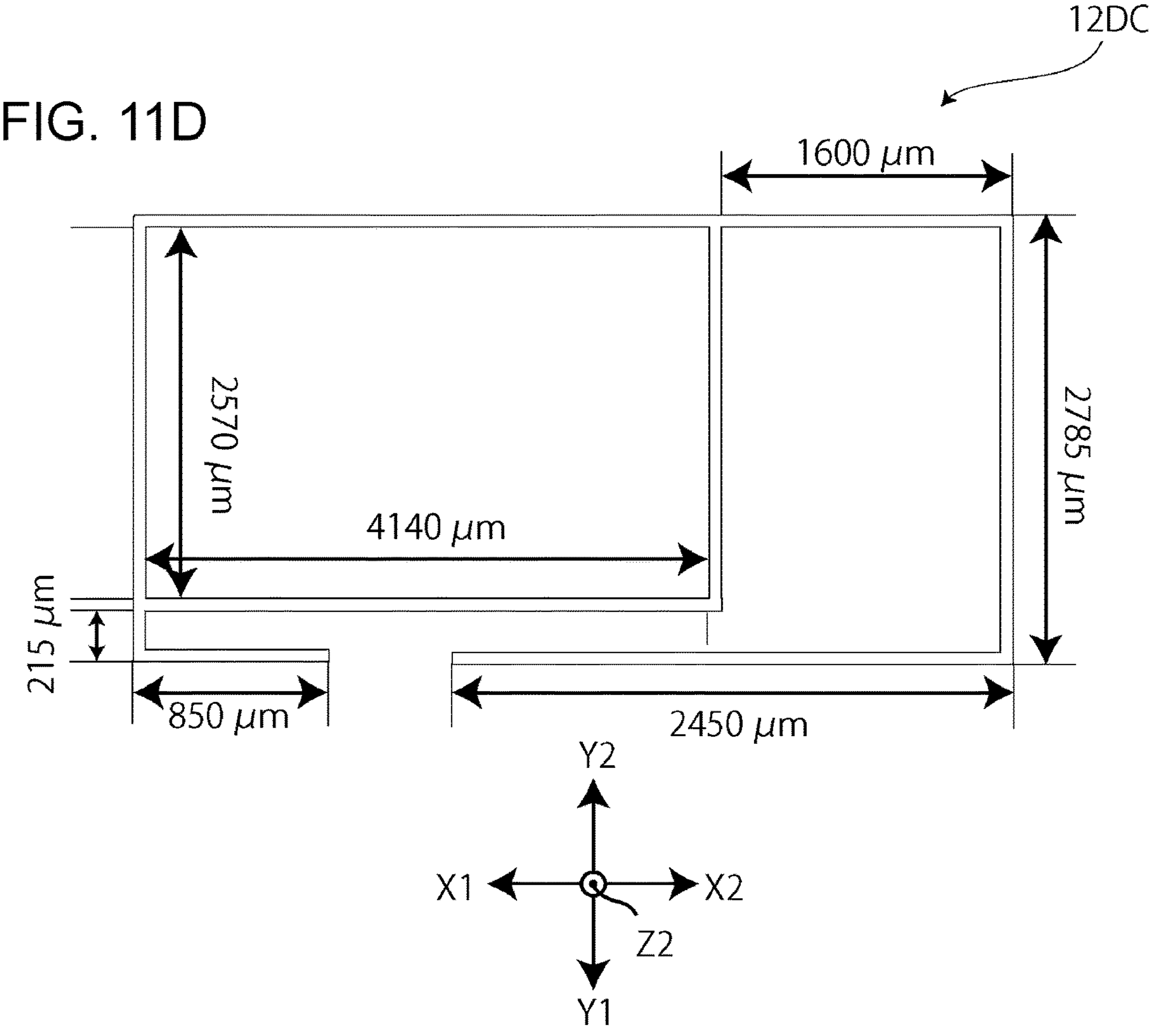
FIG. 11D is a plan view illustrating a configuration of a DC electric wiring of the magnetic sensor according to the example.

FIGS. 11A to 11D illustrate a configuration of the magnetic sensor simulated in an example, FIG. 11A is a plan view illustrating sizes of the soft magnetic material 15, FIG. 11B is a cross-sectional view illustrating sizes and arrangement of the individual portions, FIG. 11C is a plan view illustrating a shape and sizes of the AC electric wiring 12AC, and FIG. 11D is a plan view illustrating a shape and sizes of the DC electric wiring 12DC.

Simulation calculation is performed for the magnetic detection element 11, the AC electric wiring 12AC, the DC electric wiring 12DC, and the soft magnetic material 15 using the sizes and the arrangements illustrated in FIGS. 11A to 11D.

In Examples 1 to 6, a width WAC and a thickness (film thickness) TAC of the AC electric wiring 12AC and a width WDC and a thickness (film thickness) TDC of the DC electric wiring 12DC are illustrated in Tables 1 and 2. Components other than different components described in Table 1 are common in Examples.

It is assumed, in the simulation calculation, which the resistivity of AC electric wiring 12AC and the DC electric wiring 12DC is set at 0.0345 μΩ/m. For example, when the AC electric wiring 12AC has a width of 30 μm and a thickness of 0.23 μm, a resistance value is as follows.

$$((1300+1600+1200)\times 2+(2170+4140)/2)/30/0.23\times 0.0345\approx 57\Omega$$

Furthermore, when the DC electric wiring 12DC has a width of 50 μm and a thickness of 0.23 μm, a resistance value is as follows.

$$(215+850+1600+2785+2450+(2570+4140)/2)/50/0.23\times 0.0345\approx 34\Omega$$

In Example 1, the DC electric wiring 12DC is positioned closer to the magnetic detection element 11 than the AC electric wiring 12AC. In Examples 2 to 4, the AC electric wiring 12AC is positioned closer to the magnetic detection element 11 than the DC electric wiring 12DC.

In Example 5, one DC electric wiring 12DC is arranged on each side of the AC electric wiring 12AC in the X-axis direction. A distance in the Z-axis direction between the AC electric wiring 12AC and the DC electric wiring 12DC and the magnetic detection element 11 is set to 0.20 μm. A distance in the X-axis direction between the AC electric wiring 12AC and the DC electric wirings 12DC on both sides is set to 0.30 μm each.

In Example 6, one AC electric wiring 12AC is arranged on each side of the DC electric wiring 12DC in the X-axis direction. A distance in the Z-axis direction between the AC electric wiring 12AC and the DC electric wiring 12DC and the magnetic detection element 11 is set to 0.2 μm. A distance in the X-axis direction between the DC electric wiring 12DC and the AC electric wiring 12AC on both sides is set at 0.30 μm each.

Table 1 shows alternate current and power consumption of the AC electric wiring 12AC obtained by simulation calculation for the current sensors of Examples 1 to 6, and Table 2 shows direct current and power consumption of DC electric wiring 12DC obtained by simulation calculation for the current sensors of Examples 1 to 6.

TABLE 1

| | Examples (AC Electric Wiring 12 AC) | | | | | |
|---|---|---|---|---|---|---|
| | 1 | 2 | 3 | 4 | 5 | 6 |
| Reference FIG. | FIG. 6 | FIG. 7 | FIG. 7 | FIG. 7 | FIG. 8 | FIG. 9 |
| Film Thickness TAC [μm] | 3 | 0.23 | 0.23 | 2 | 3 | 3 |
| Width WAC [μm] | 20 | 30 | 70 | 30 | 20 | 20 |
| Resistance Value [ohm] | 6.6 | 57 | 24.4 | 6.6 | 6.6 | 4.9 |
| Generated Magnetic Field [Oe/mA] | 0.87 | 0.86 | 0.73 | 0.84 | 0.87 | 1.18 |
| Hs [Oe] | 50 | 50 | 50 | 50 | 50 | 50 |
| Alternate Current [mA] | 57 | 58 | 68 | 59 | 57 | 85 |
| Power Consumption [mW] | 11 | 97 | 57 | 12 | 11 | 18 |

TABLE 2

| | Examples (DC Electric Wiring 12 DC) | | | | | |
|---|---|---|---|---|---|---|
| | 1 | 2 | 3 | 4 | 5 | 6 |
| Reference FIG. | FIG. 6 | FIG. 7 | FIG. 7 | FIG. 7 | FIG. 8 | FIG. 9 |
| Film Thickness TDC [μm] | 0.23 | 0.23 | 0.23 | 0.23 | 3 | 3 |
| Width WDC [μm] | 50 | 50 | 50 | 50 | 20 | 20 |
| Resistance Value [ohm] | 34.2 | 34.2 | 34.2 | 34.2 | 4.9 | 6.6 |
| Generated Magnetic Field [Oe/mA] | 0.78 | 0.77 | 0.77 | 0.74 | 1.18 | 0.87 |
| Hi' [Oe] | 10 | 10 | 10 | 10 | 10 | 10 |
| Alternate Current [mA] | 13 | 13 | 13 | 14 | 17 | 11 |
| Power Consumption [mW] | 5.6 | 5.8 | 5.8 | 6.2 | 1.4 | 0.4 |

From the results illustrated in Tables 1 and 2, it can be said that power consumption may be suppressed by increasing cross-sectional areas of both the AC electric wiring 12AC and the DC electric wiring 12DC. Therefore, it can be said that burying of at least a portion of the AC electric wiring 12AC in the substrate 13 for increase in a cross-sectional area is effective for reduction of power consumption of the magnetic sensor 1.

The present invention is useful as a magnetic sensor with high magnetic resolution that is used in a medical field and in test of various devices that can detect weak magnetic fields with high accuracy.

What is claimed is:

1. A magnetic sensor comprising:
a substrate;
at least one magnetic detection element formed on the substrate via an insulating layer, the magnetic detection element having a detection axis in an in-plane direction of the substrate and an output signal characteristic which is an even function of a magnetic field in a direction of the detection axis;
an alternate current (AC) electric wiring configured to apply an AC magnetic field to the magnetic detection element;
a direct current (DC) electric wiring configured to apply a DC magnetic field to the magnetic detection element,
wherein the magnetic detection element, the AC electric wiring, and the DC electric wiring are electrically isolated from one another, and
wherein at least a portion of the AC electric wiring is embedded buried in the substrate.

2. The magnetic sensor according to claim 1,
wherein at least a portion of the DC electric wiring is embedded in the substrate.

3. The magnetic sensor according to claim 1,
wherein the DC electric wiring is arranged between the magnetic detection element and the AC electric wiring viewed from a direction orthogonal to a normal direction of the substrate and to the detection axis of the magnetic detection element.

4. The magnetic sensor according to claim 2,
wherein the AC electric wiring is arranged between the magnetic detection element and the DC electric wiring viewed from a direction orthogonal to a normal direction of the substrate and to the detection axis of the magnetic detection element.

5. The magnetic sensor according to claim 2,
wherein the DC electric wiring is formed in parallel to the AC electric wiring viewed from a direction orthogonal to a normal direction of the substrate and to the detection axis of the magnetic detection element.

6. The magnetic sensor according to claim 5,
wherein the AC electric wiring includes a portion overlapping with the magnetic detection element viewed from the normal direction of the substrate.

7. The magnetic sensor according to claim 1,
wherein a cross-sectional area of the AC electric wiring is larger than a cross-sectional area of the DC electric wiring viewed from a direction orthogonal to a normal direction of the substrate and to the detection axis of the magnetic detection element.

8. The magnetic sensor according to claim 1,
wherein the at least one magnetic detection element includes a plurality of magnetic detection elements, the magnetic sensor further comprising:
a bridge circuit formed of the plurality of magnetic detection elements.

9. The magnetic sensor according to claim 1, further comprising:
a soft magnetic material formed on the substrate via the insulating layer such that the soft magnetic material is disposed more distally from the substrate than the magnetic detection element.

10. The magnetic sensor according to claim 1,
wherein the substrate is a silicon substrate and the AC electric wiring is formed by a damascene process.

* * * * *